United States Patent [19]
Nakashima et al.

[11] Patent Number: 5,494,780
[45] Date of Patent: Feb. 27, 1996

[54] METHOD OF MANUFACTURING A PRINTED CIRCUIT BOARD

[75] Inventors: Kunji Nakashima, Kobe; Toshiyuki Suzuki, Nara; Atsuhiro Nakamoto, Kobe; Yoshitaka Tezuka, Daito; Ryuji Otani, Osaka, all of Japan

[73] Assignee: Matsushita Electric Works, Ltd., Osaka, Japan

[21] Appl. No.: 267,942

[22] Filed: Jul. 6, 1994

[51] Int. Cl.⁶ .................................................. G03F 7/20
[52] U.S. Cl. ........................... 430/313; 430/311; 430/396
[58] Field of Search .................................... 430/311, 313, 430/314, 315, 318, 396

[56] References Cited

U.S. PATENT DOCUMENTS

| | | | |
|---|---|---|---|
| 4,904,569 | 2/1990 | Fukuda et al. | 430/311 |
| 5,168,624 | 12/1992 | Shirai . | |

FOREIGN PATENT DOCUMENTS

| | | |
|---|---|---|
| 453753A2 | 10/1991 | European Pat. Off. . |
| 1-298792 | 12/1989 | Japan . |

Primary Examiner—Kathleen Duda
Attorney, Agent, or Firm—Armstrong, Westerman, Hattori, McLeland & Naughton

[57] ABSTRACT

In a method of manufacturing a printed circuit board, a photoresist layer is formed on a three-dimensionally molded substrate through a conductive layer. A planar photomask which is provided with a mask pattern and a light-transmissive pattern is placed in front of the photoresist layer. A parallel light beam is radiated to the photomask in order to give to the photoresist layer an exposed pattern of an intended width "L" in correspondence to the light-transmissive pattern. In the present invention, the light-transmissive pattern is configured so as to satisfy the following relations:

when $D=0$, $W/L=1$,
when $D>0$, $W/L<1$, wherein "W" is a width of the light-transmissive pattern for forming the exposed pattern of the intended width "L", and "D" is a distance between the light-transmissive pattern and the photoresist layer. The photoresist layer of the exposed or an non-exposed pattern is removed to leave a patterned area of the conductive layer without the photoresist layer. A circuit pattern is formed on the substrate in accordance with the patterned area of the conductive layer. Since the light-transmissive pattern of the photomask is configured so as to reduce the influence of diffraction of the parallel light beam at the light-transmissive pattern, the circuit pattern can be precisely formed on the substrate.

18 Claims, 25 Drawing Sheets

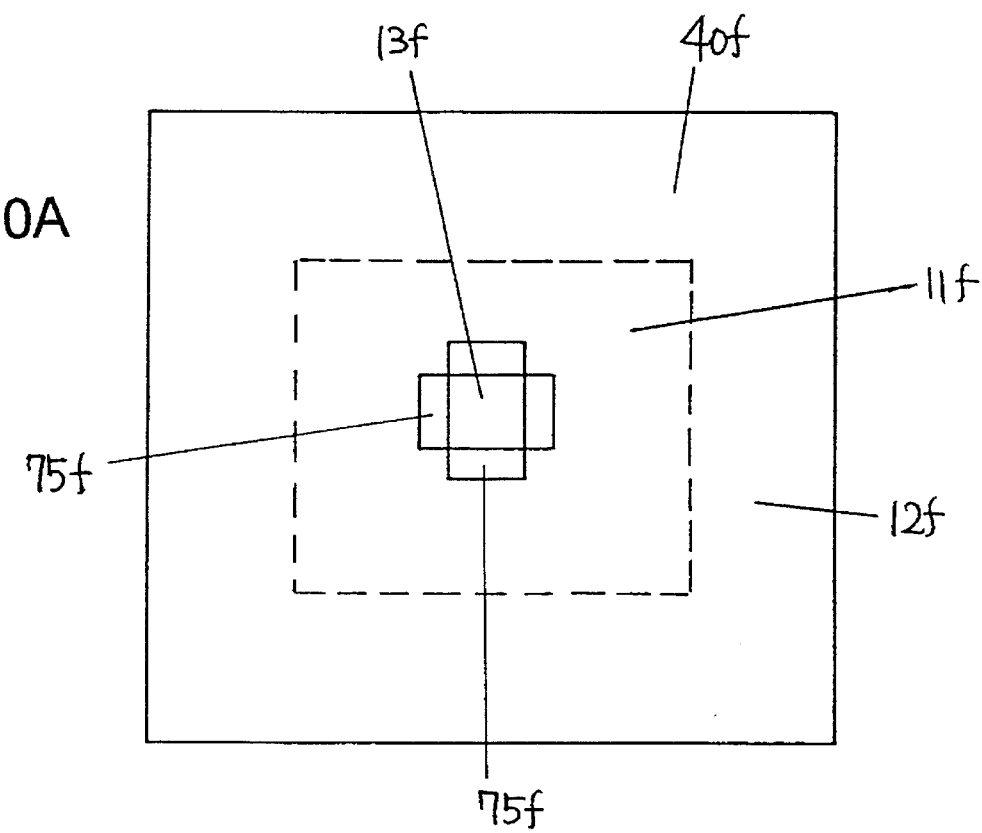
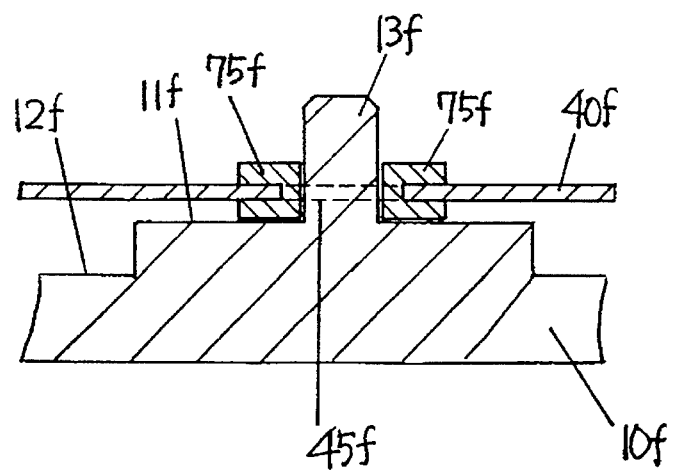

Fig. 15A
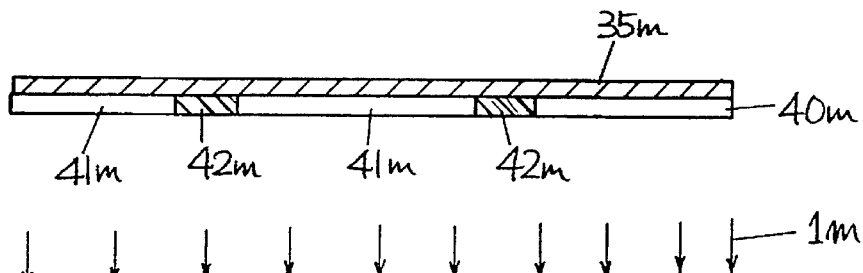
Fig. 15B
Fig. 15C
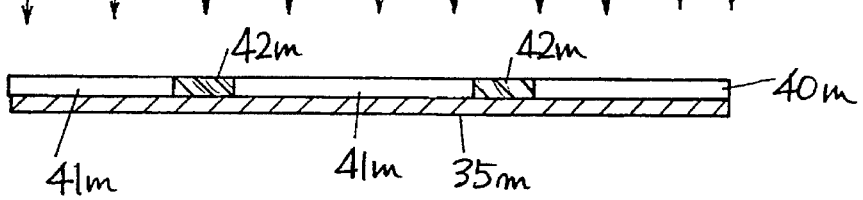
Fig. 15D
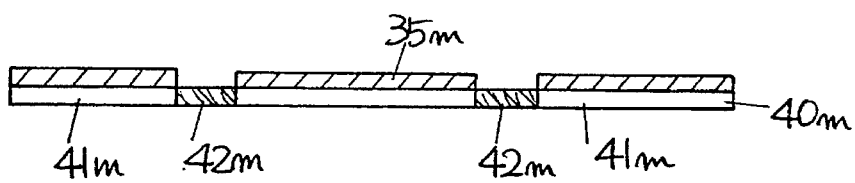
Fig. 15E
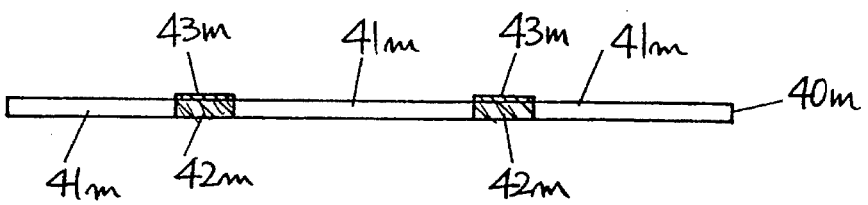

METHOD OF MANUFACTURING A PRINTED CIRCUIT BOARD

BACKGROUND OF THE INVENTION

1. Field of the Invention

The present invention is relates to a method of manufacturing a printed circuit board, and particularly a method of precisely forming a circuit pattern of a conductive material on a three-dimensionally molded substrate.

2. Disclosure of the Prior Art

For manufacturing a printed circuit board which is provided with a circuit pattern of a conductive material on an irregular surface of a three-dimensionally molded substrate, it is difficult to directly adopt the prior art's methods of forming a circuit pattern on a flat surface of a substrate. Therefore, for replying the demands, a variety of unique methods of manufacturing such a printed circuit board have been proposed.

For example, a Japanese Patent Early Publication [KOKAI] No. 1-298792 discloses a method of manufacturing a printed circuit board. A metallic layer is formed on an irregular surface of a three-dimensionally molded substrate, and also a photoresist layer is formed on the metallic layer. A cubical photomask is formed with a body made of a light-transmissive material, a replica surface fitted to the irregular surface, and a mask pattern described on the replica surface. The photomask is placed on the substrate such that the replica surface is precisely fitted to the irregular surface of the substrate. A light beam is radiated to the photoresist layer through the photomask to obtain an exposed pattern of the photoresist layer. The photoresist layer of the exposed pattern is removed to leave a first area of the metallic layer without the photomask layer. An additional metallic layer is formed on the first area of the metallic layer by an electrodeposition or electroless deposition technique. Subsequently, the photoresist layer of an non-exposed pattern is removed to leave a second area of the metallic layer. The metallic layer of the second area is etched to form the circuit pattern of the metallic layer corresponding to the first area on the irregular surface of the substrate.

However, the cubical photomask having such a replica surface needs an expensive production cost and a lot of making steps thereof. In addition, since the photomask is formed by casting, for example, a silicon resin into the irregular surface of the substrate and hardening the resin, it would be difficult to precisely form the replica surface of the photomask as the irregular surface of the substrate becomes more complex.

On the other hand, U.S. Pat. No. 5,168,624 discloses another method of manufacturing a printed circuit board comprising the following steps. A conductive layer 20w is formed on an irregular surface of a three-dimensionally molded substrate 10w, and also an electrodeposited resist 30w is formed on the conductive layer 20w. A parallel light beam is radiated to a photomask 40w placed in front of the electrodeposited resist 30w to obtain an exposed pattern of the electrodeposited resist 30w, as shown in FIG. 22. The photomask 40w is formed with a mask pattern 41w and a light-transmissive pattern 42w. After the electrodeposited resist 30w of the exposed pattern is removed to leave a patterned area of the conductive layer 20w without the electrodeposited resist 30w, the conductive layer 20w of the patterned area is etched to form a circuit pattern of the conductive layer 20w corresponding to a non-exposed pattern of the electrodeposited resist 30w on the irregular surface of the substrate 10w.

However, when the parallel light beam is radiated to the irregular surface through the photomask 40w, there causes a problem of diffraction of the parallel light beam at the light-transmissive pattern 42w, which becomes more pronounced as a distance "D" between the light-transmissive pattern 42w and the electrodeposited resist 30w increases. That is, a width of the electrodeposited resist 30w exposed to the parallel light beam passing through a first light-transmissive pattern 43w which substantially contacts with the electrodeposited resist 30w, that is, D1=0, would be equal to a width of the first light-transmissive pattern 43w. However, a width of the electrodeposited resist 30w exposed to the parallel light beam passing through a second light-transmissive pattern 44w which is spaced away from the electrodeposited resist 30w by a distance "D2", that is, D2>0, becomes wider than a width of the second light-transmissive pattern 44w because of the influence of diffraction. Therefore, when the three-dimensionally molded substrate 10w has a considerable irregular surface, it would be difficult to precisely form on the irregular surface a circuit pattern of the conductive layer 20w.

SUMMARY OF THE INVENTION

For improving the above problems, a primary object of the present invention is to provide a method of manufacturing a printed circuit board, and particularly precisely forming a circuit pattern on a three-dimensionally molded substrate. In the present method, a three-dimensionally molded substrate having a first surface and at least one second surface lower than the first surface is used. A conductive layer is formed on the first and second surface, and also a photoresist layer is formed on the conductive layer. A planar photomask is placed in front of the photoresist layer and substantially parallel to the first and second surfaces. The photomask is formed with a mask pattern and a light-transmissive pattern such as a slit. A parallel light beam is radiated to the photoresist layer through the photomask in order to give to the photoresist layer an exposed pattern of an intended width "L". In the present invention, the light-transmissive pattern is configured so as to satisfy the following relations:

when D=0, W/L=1, when D>0, W/L<1, wherein "W" is a width of the light-transmissive pattern for forming the exposed pattern of the intended width "L", and "D" is a distance between the light-transmissive pattern and the photoresist layer. After the radiation, the photoresist layer of the exposed pattern or an non-exposed pattern is removed to leave a patterned area of the conductive layer without the photoresist layer. A circuit pattern is formed on the substrate in accordance with the patterned area of the conductive layer. Since the light-transmissive pattern of the photomask is configured so as to reduce the influence of diffraction of the parallel light beam at the light-transmissive pattern, the circuit pattern can be precisely formed on the three-dimensionally molded substrate.

In a preferred embodiment of the present invention, when a positive-working photoresist is used as the photoresist layer, the photoresist layer of the exposed pattern is removed to leave the patterned area of the conductive layer without the photoresist layer. On the contrary, when a negative-working photoresist is used as the photoresist layer, the photoresist layer of the non-exposed pattern is removed to leave the patterned area Of the conductive layer without the photoresist layer.

In a further preferred embodiment of the present invention, when the substrate is formed with a plurality of the second surfaces at varying elevations, and there is a particular area satisfying that the distance (D) is larger than a threshold distance (Dmax), an additional planar photomask is placed in front of the photoresist layer of the particular area. Consequently, it is possible to precisely form a circuit pattern on a three-dimensionally molded substrate having a considerable unevenness. In particular, it is preferred that a light-transmissive pattern of the additional photomask is configured in the above explained manner.

In a still further preferred embodiment of the present invention, the photomask and the additional photomask have marginal portions which are overlapped with each other with respect to a radiating direction of the parallel light beam. Consequently, even when the parallel light beam is radiated to the photomasks at once, it is possible to prevent undesired exposure of the photoresist layer caused by a light beam diffracted at the marginal portion of one of the photomasks, which is placed at a higher position than the other one.

In another preferred embodiment of the present invention, a photomask is formed with a light-transmissive plate and two same mask patterns made of a light-absorption material which are formed on the opposite surfaces of the plate such that one of the mask patterns is completely overlapped with the other one with respect to a radiating direction of the parallel light beam. In other words, two same light-transmissive patterns are also formed on the opposite surfaces of the plate so as to overlap each other. When the parallel light beam is radiated to an upper surface of the photomask, a light beam diffracted at the light-transmissive pattern of the upper surface can be efficiently absorbed by the mask pattern on a lower surface of the photomask.

For more complete understanding of the present invention and its construction and advantages, reference should be made to the following description and the drawings.

BRIEF DESCRIPTION OF THE DRAWINGS

FIGS. 10A and 10B illustrate a way of fixing a photomask in front of a substrate;

FIGS. 15A to 15E illustrate a method of manufacturing a photomask used in a fourths embodiment of the present invention;

DETAILED DESCRIPTION OF THE PREFERRED EMBODIMENTS

[First Embodiment]

A method of manufacturing a printed circuit board of the present invention is explained in order, referring the attached drawings.

Figure 1A:
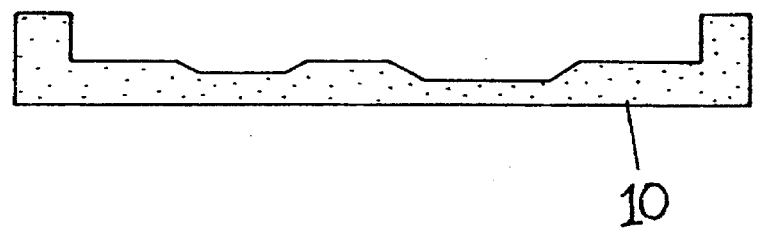
FIGS. 1A to 1H illustrate a method of manufacturing a printed circuit board of a first embodiment of the present invention.

[1] A step of preparing a three-dimensionally molded substrate 10:

A liquid crystal polymer is used as a material of the substrate. The polymer is molded to a required shape by applying an injection molding technique. For example, the injection molding is performed under the conditions of a mold temperature of 130° C., a polymer temperature of 310° C. and an injection time of 4 to 5 seconds. Then, the molded polymer is dried for removing a moisture included therein, to thereby obtain the three-dimensionally molded substrate 10, as shown in FIG. 1A.

[2] A step of forming a conductive layer 20 on the substrate 10

Figure 1B:
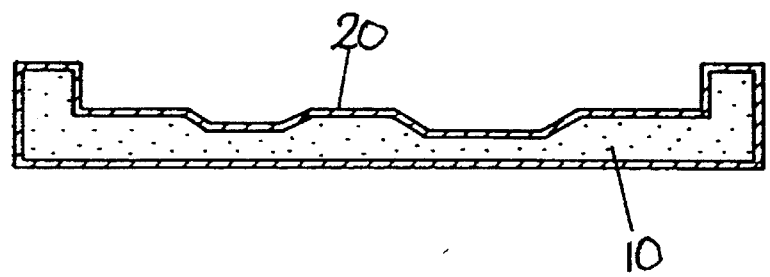

A copper layer is formed as the conductive layer 20 on the substrate 10 by an electroless deposition of copper, as shown in FIG. 1B. For example, a process of the electroless deposition of copper is explained below. First, the substrate 10 is degreased with an aqueous solution of an alkali surfactant. A roughing treatment of the substrate surface is performed by etching the substrate 10 with a NaOH or KOH aqueous solution at an etching temperature, e.g., 70° C., in order to obtain an improved adhesion between the copper layer 20 and the substrate 10 after the electroless deposition of copper. Thus roughened surface of the substrate 10 is washed with water to fully remove etched residues therefrom, and then is treated with a HCl aqueous solution at a room temperature to neutralize the roughened surface etched by the alkali aqueous solution. The substrate surface is also treated with an acid surfactant to improve a wetting property of water thereto. Subsequently, nucleuses of palladium are added as a catalyst to the substrate surface with the use of an aqueous solution of a tin/palladium colloid. After an activation treatment of removing tin from colloid particles of tin/palladium added to the substrate surface and reducing to metallic palladium is performed, the substrate 10 is dipped into an electroless deposition bath including a NaOH aqueous solution, formalin as a reducing agent, and a complex compound of copper ($CuSO_4$ +EDTA). In this electroless deposition, an oxidation-reduction reaction from the complex compound of copper to metallic copper occurs, so that a copper layer 20 having a thickness of about 0.5 μm to 2.0 μm is formed on the substrate 10. By the way, when the NaOH aqueous solution is used for the roughing treatment of the substrate, it is possible to safely perform the roughing treatment without using a chromic acid which is a harmful substance to the natural environment.

[3] A step of forming a photoresist layer 30 on the conductive layer 20

Figure 1C:
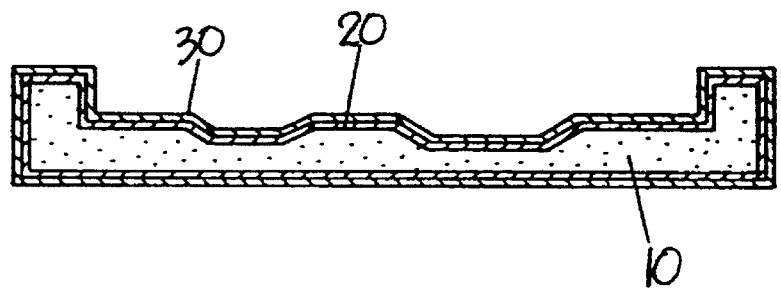
Figure 1D:
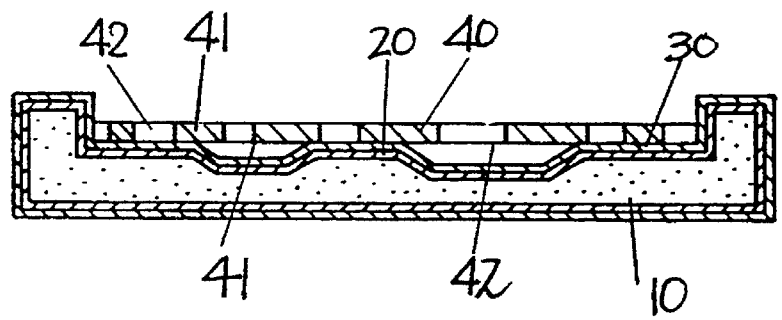

A positive-working photoresist layer 30 is formed on the copper layer 20 by applying an electrodeposition technique, as shown in FIG. 1C. For example, a process of the electrodeposition of the photoresist layer is explained below. After the copper layer 20 obtained in the above step [2] is treated with a sulfuric acid aqueous solution as a pretreatment, the substrate 10 is dipped into a photoresist solution. The photoresist solution is an aqueous solution dissolving a cationized acrylic resin at an emulsion state therein. After a positives electrode and the substrate 10 connected to a negative electrode are dipped into the photoresist solution, the photoresist layer 30 is formed on the copper layer 20 by flowing a direct current between both electrodes in accordances with a conventional electrodeposition technique. In this embodiment, a direct voltage of 50 V was applied between the electrodes for about 40 seconds while keeping a temperature of the photoresist solution at about 22° C. In addition, it is preferred that the electrodeposition of the photoresist layer is performed while rocking the substrate for forming an uniform photoresist layer 30 on the conductive layer 20.

[4] A step of exposing the photoresist layer 30 to a parallel light beam through a planar photomask 40

A parallel light beam of ultraviolet having a photo energy, e.g., 600 mJ (1000 count), is radiated to the photomask 40 placed in front of the photoresist layer 30 in order to give to the photoresist layer 30 an exposed pattern of an intended width "L". The photomask is formed with a mask pattern 41 and a light-transmissive pattern 42 such as a slit. In the present invention, the light-transmissive pattern 42 is configured so as to satisfy the following relations:

when D=0, W/L=1,
when D>0, W/L<1, wherein "W" is a width of the light-transmissive pattern 42 for forming the exposed pattern of the intended width "L", and "D" is a distance between the light-transmissive pattern and the photoresist layer 30.

Figure 2A:
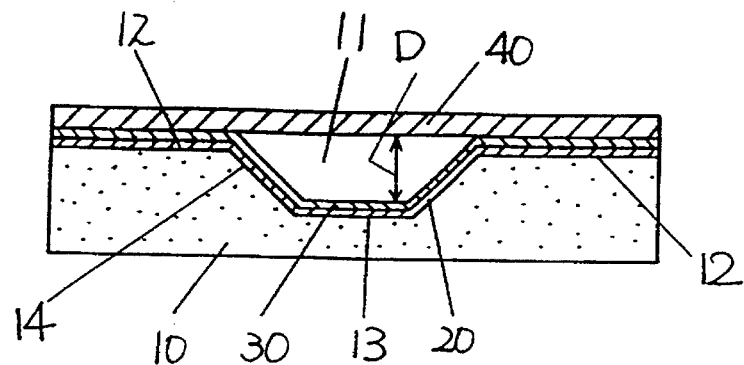
FIGS. 2A to 2E explain a comparison between light-transmissive patterns of photomasks of the present invention and the prior art, which are used to form a linearly exposed area of a photoresist layer on an irregular surface of a substrate.
Figure 2B:
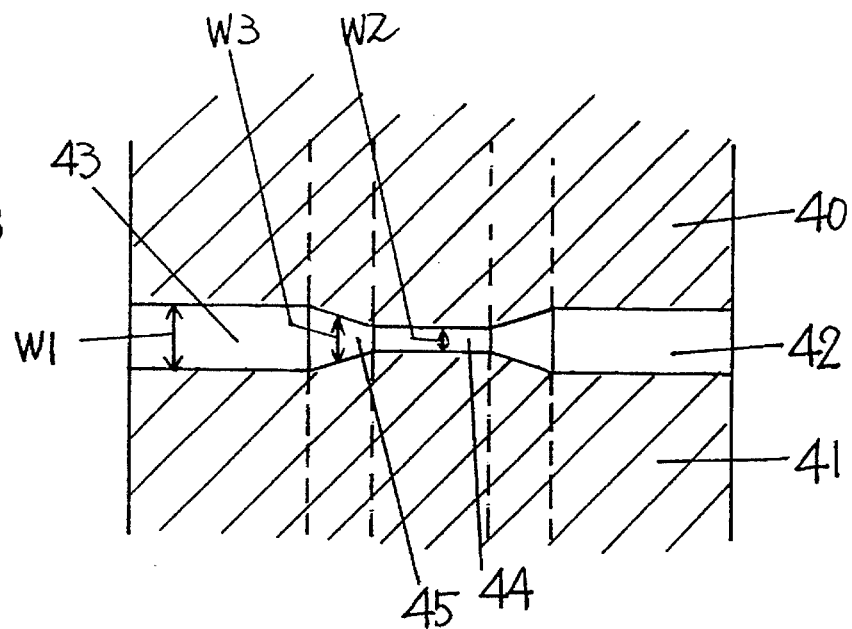
Figure 2C:
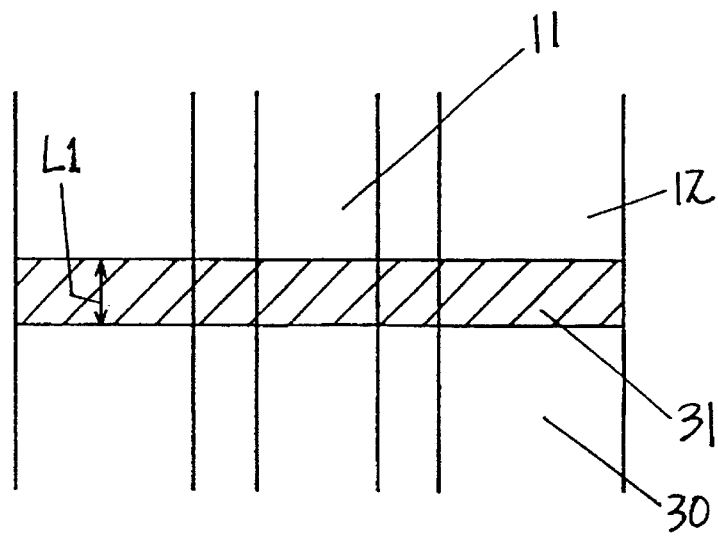

For more complete understanding of the present invention, the followings are explanations with respect to a configuration of the light-transmissive pattern 42 of the photomask 40 which is used for forming a linearly exposed area 31 of the photoresist layer 30 extending across a concave portion 11 of the substrate 10. As shown in FIG. 2A, the substrate 10 is formed with a top surface 12 and the concave portion 11 having a bottom surface 13 and a slope surface 14 extending between the top and bottom surfaces. A height of the top surface 12 from the bottom surface 13 is about 8 mm. An angle of the slope surface 14 against the bottom surface 13 is about 70 degree. For forming the linearly exposed area 31 on the photoresist layer extending across the concave portion 11, the light-transmissive pattern 42 of the photomask 40 is configured, as shown in FIG. 2B, which is a top plane view of FIG. 2A. That is, the light-transmissive pattern is formed with a first width portion 43, a second width portion 44 narrower than the first width portion 43 and a third width portion 45 extending between the first and second width portions. In this explanation, since the planar photomask 40 is directly placed on the photoresist layer 30, a distance between the photoresist layer 30 on the top surface 12 and the first width portion 43 of the photomask 40 is zero, as shown in FIG. 2A. Therefore, a width "L1" of the photoresist layer 30 exposed to the parallel light beam passing through the first width portion 43 is equal to a width "W1" of the first width portion 43. On the other hand, since the photomask 40 is spaced away from the photoresist layer 30 by the concave portion 11, there causes a diffraction of the parallel light beam at the second and third width portions 44 and 45 of the light-transmissive patterns 42. The diffraction gives rise to undesired exposure of the photoresist layer, and becomes more pronounced as the distance "D" between the photoresist layer 30 and the photomask 40 increases. However, in the present invention, a width "W2" of the second width portion 44 and a width "W3" of the third width portion 45 are respectively determined such that widths of the photoresist layer exposed to the parallel light beam passing through the second and third width portions are equal to the width "L1" of the photoresist layer exposed to the parallel light beam passing through the first width portion 43. In other words, the second and third width portions 44 and 45 are configured in such a manner that the widths "W2" and "W3" of the second and third width portions are narrower than the width "W1" of the first width portion 43 of the light-transmissive pattern 42, as the distance "D" between the photoresist layer 30 and the photomask 40 increases.

Figure 2D:
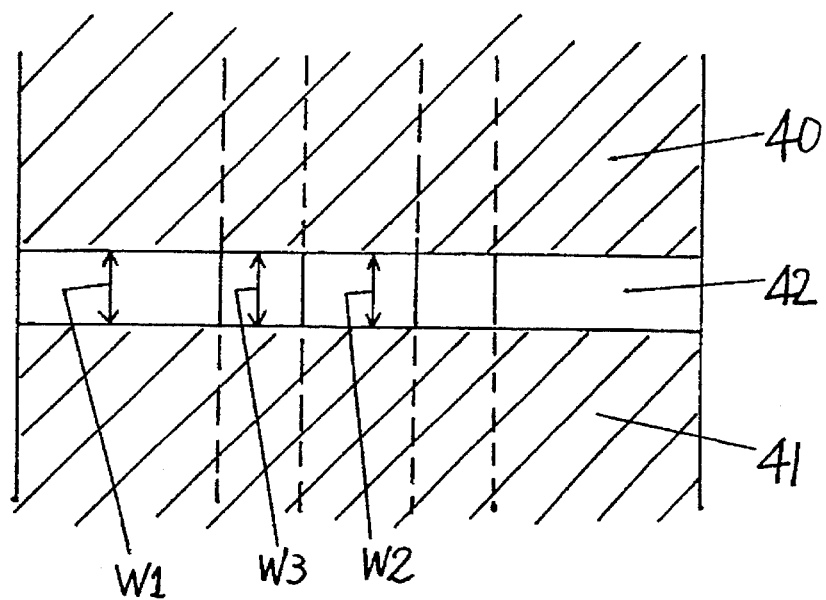
Figure 2E:
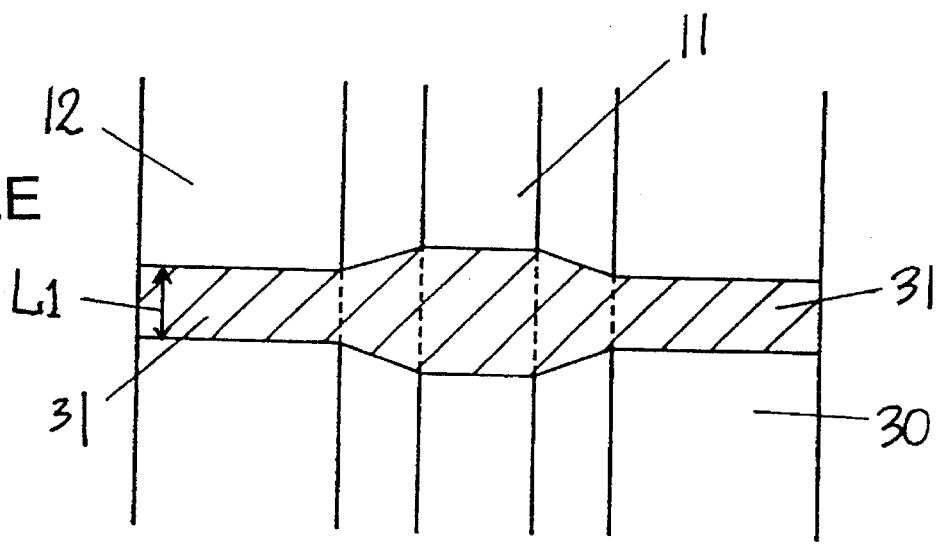

As a comparison, if the width "W1" of the first width portion 43 is adopted as the widths "W2" and "W3" of the second and third width portions 44 and 45, as shown in FIG. 2D, widths of the photoresist layer 30 exposed to the parallel light beam passing through the second and third width portions would be not equal to the width "W1" of the first width portion 43 due to the diffraction of the parallel light beam, as shown in FIG. 2E.

Therefore, when the light-transmissive pattern 42 of the photomask 40 is configured in accordance with the above explained manner, it is possible to precisely give the linearly exposed area 31 to the photoresist layer 30 across the concave portion 11 of the substrate 10.

By the way, a relation between the width "W" of the light-transmissive pattern 42 and the width "L" of the photoresist layer 30 exposed to the parallel light beam passing through the light-transmissive pattern is expressed as a function of the distance "D" between the light-transmissive pattern and the photoresist layer. For example, the relation is obtained by measuring a width of a photoresist layer exposed to an ultraviolet beam having the energy of 300 $mJ/cm^2$ passing through a light-transmissive pattern having the width of 200 μm, while varying the distance "D". Results of the measurement are listed on TABLE 1. Therefore, the light-transmissive pattern 42 of the photomask 40 of the present invention can be configured in accordance with thus measured relation.

TABLE 1

| Distance (mm)[1] | Width of Exposed Area (μm)[2] |
| --- | --- |
| 0 | 199 |
| 1.5 | 206 |
| 3.0 | 220 |
| 4.5 | 245 |
| 6.0 | 268 |
| 7.5 | 294 |
| 9.0 | 318 |
| 10.5 | 357 |

Figure 3A:
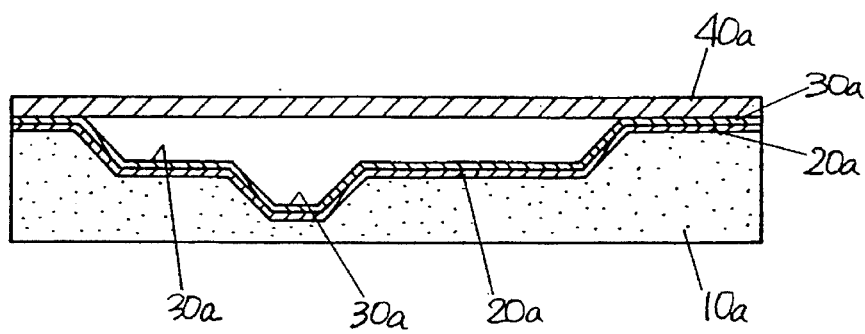
FIGS. 3A to 3C illustrate a light-transmissive pattern of a photomask configured according to the present invention for forming a complex pattern of an exposed photoresist layer.
Figure 3B:
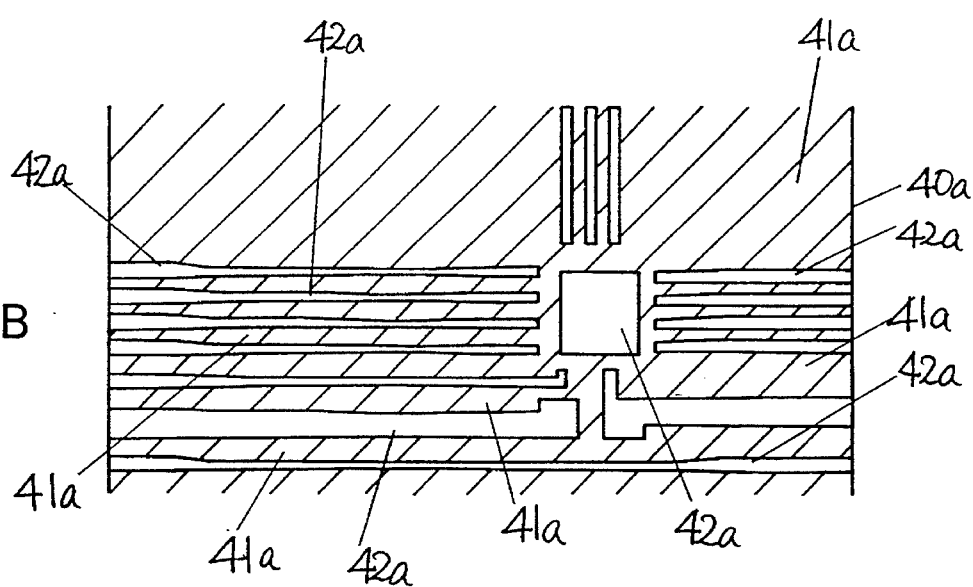
Figure 3C:
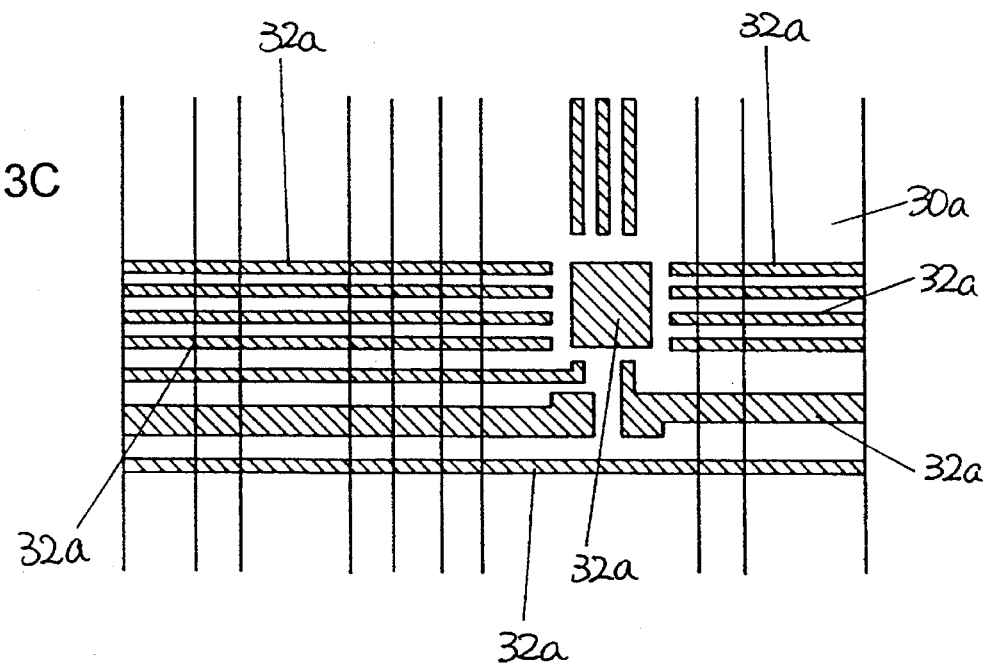

[1]The distance between a planar photomask and a photoresist layer
[2]The width of the photoresist layer exposed to a parallel light passing through the photomask when the photomask is spaced away from the photoresist layer by the distance For example, for precisely forming a complex pattern 32a of an exposed photoresist layer, as shown in FIG. 3C, it is preferred to use a planar photomask 40a which is provided with complex mask pattern 41a and light-transmissive pattern 42a configured in accordance with the present manner, as shown in FIG. 3B. A photoresist layer 30a is formed on a three-dimensionally molded substrate 10a through a conductive layer 20a, as shown in FIG. 3A.

[5] A step of forming a circuit pattern on the substrate

After the radiation, the exposed pattern of the photoresist layer 30 is removed to leave a patterned area of the copper layer 20 which is not covered with the photoresist layer 30. The circuit pattern is formed on the substrate 10 according to the patterned area of the copper layer 20.

By the way, though the positive-working photoresist layer 30 is used in this embodiment, it is possible to use a negative-working photoresist layer instead of that one. Therefore, in case of using the negative-working photoresist, after the radiation, a non-exposed pattern of the photoresist layer is removed to leave a patterned area of the copper layer 20 without the photoresist layer 30, and a circuit pattern is formed on the substrate 10 in accordance with the patterned area of the copper layered 20.

Figure 1E:
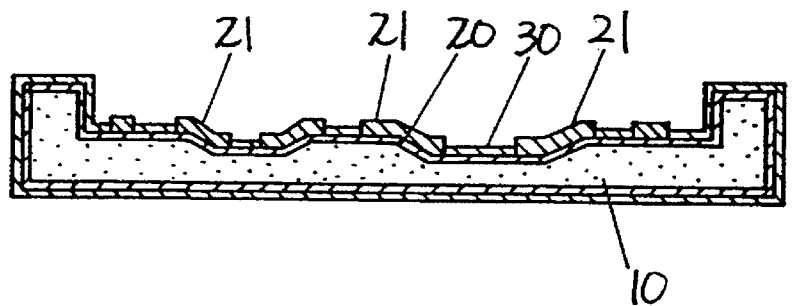

For example, a process of forming the circuit pattern is explained below. The copper layer 20 of the patterned area is degreased with an alkali surfactant at a degreasing temperature. After the copper layer 20 is cleaned with a sulfuric acid aqueous solution, an additional copper layer 21 is deposited on the patterned area of the copper layer 20 by applying an electrodeposition technique, as shown in FIG. 1E. For example, the additional copper layer 21 is electrodeposited with the use of a deposition bath including a copper sulfate aqueous solution with the concentration of 80 g/l, a sulfuric acid aqueous solution with the concentration of 180 g/l, and an aqueous solution having chlorine ions with the concentration of 50 mg/l. A thickness of the additional copper layer 21 is about 15 μm.

Figure 1F:
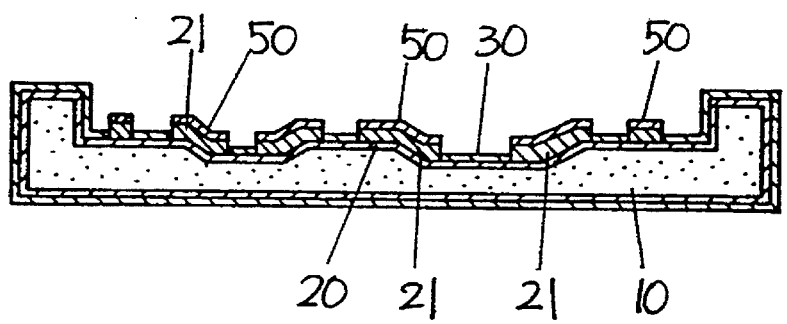

Subsequently, a nickel layer 50 is formed on the additional copper layer 21 by an electrodeposition technique, as shown in FIG. 1F. For example, the nickel layer 50 is electrodeposited under the conditions of a deposition temperature of about 50° C., a deposition current of 3 A/dm² and a deposition time of 25 min., with the use of a deposition bath including a nickel sulfate aqueous solution with the concentration of 270 g/l, a nickel chloride aqueous solution with the concentration of 50 g/l, and a brightener. A thickness of the nickel layer is about 5 μm.

In addition, a gold layer (not shown) is formed on the nickel layer 50 by applying an electrodeposition technique. For example, the gold layer is electrodeposited under the conditions of a deposition temperature of 65° C., a deposition current of 1 A/dm² and a deposition time of 90 seconds, with the use of a deposition bath including an aqueous solution of gold cyanide. A thickness of the gold layer is about 0.5 μm.

Figure 1G:
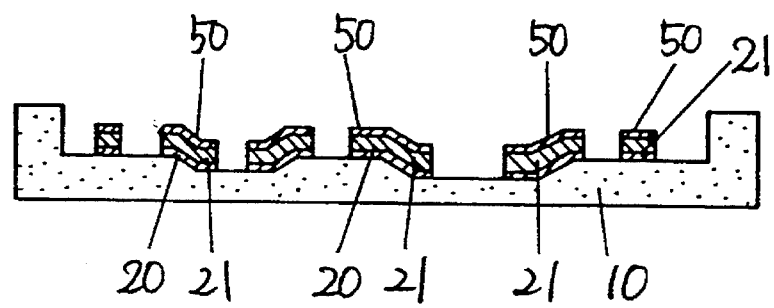
Figure 1H:
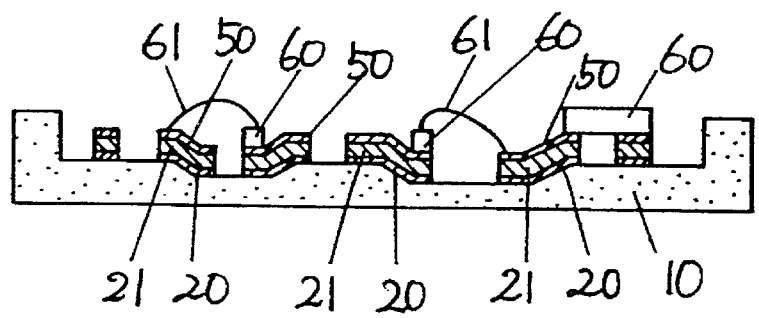

After the electrodeposition of gold, the photoresist layer 30 of the non-exposed area is removed with the use of a parting agent to leave the copper layer corresponding to the non-exposed area, as shown in FIG. 1F. Then, the copper layer 20 without the photoresist layer 30 is soft-etched with the use of ammonium persulfate to thereby obtain the circuit pattern consisting of the gold layer, nickel layer 50, additional copper layer 21 and the copper layer 20 on the substrate 10, as shown in FIG. 1G. The circuit pattern on the substrate 10 is washed with a pure water at a room temperature, and then dried. In this embodiment, a line width of the circuit pattern and a distance between the adjacent patterns widths are about 200 μm. Electrical components 60 such as a LSI, etc. are mounted on the substrate 10 or the gold layer, and connected to a required circuit pattern by a wire-bonding 61 of gold, as shown in FIG. 1H.

[Second Embodiment]

Figure 4A:
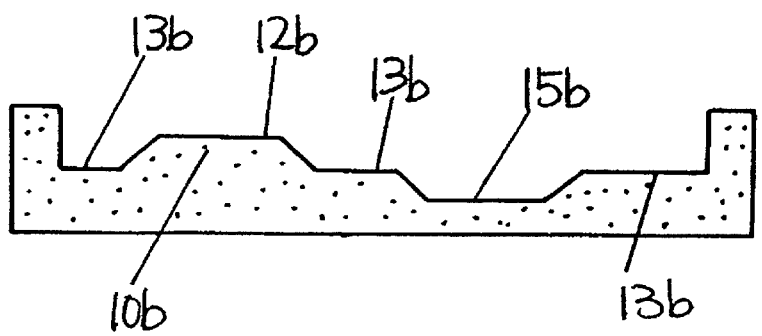
FIGS. 4A to 4G illustrate a method of manufacturing a printed circuit board of a second embodiment of the present invention.
Figure 4B:
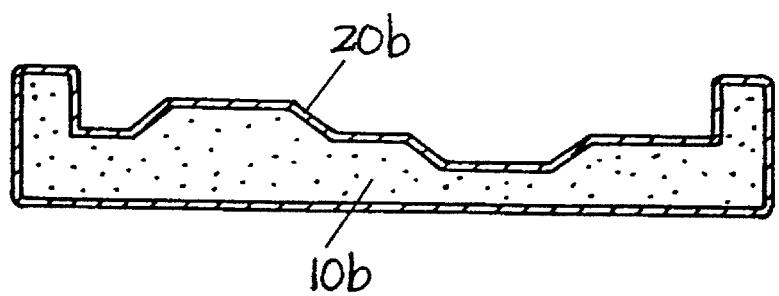
Figure 4C:
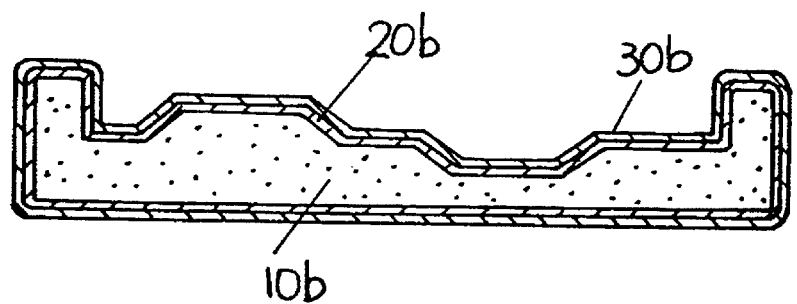

In this embodiment, a three-dimensionally molded substrate 10b having the cross section of FIG. 4A is used. The substrate 10b has a first surface 12b higher than a second surface 13b and a third surface 15b lower than the second surface 13b. As shown in FIGS. 4B and 4C, a copper layer 20b as a conductive layer and a positive-working photoresist layer 30b are formed on the substrate 10b in accordance with the substantially same manner as the above explained steps [1] to [3]. Then, a parallel light beam is radiated to photomasks 40b and 41b placed in front of the photoresist layer 30b to obtain an exposed pattern of the photoresist layer.

Figure 4D:
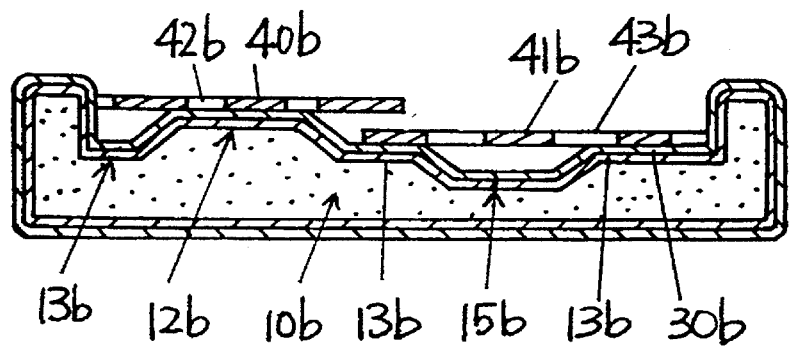

By the way, it is preferred that when there is a particular area satisfying that a distance between a planar photomask and a photoresist layer is larger than a threshold distance, at least one additional planar photomask is placed in front of the photoresist layer of the particular area. In this embodiment, since a distance between the first surface 12b and third surface 15b is larger than the threshold distance, two planar photomasks 40b and 41b are used in this case, as shown in FIG. 4D. That is, one of two planar photomasks 40b is placed on the first surface 12b so as to form a first exposed pattern of the photoresist layer 30b on the first and second surfaces 12b and 13b, and the other one of the photomasks 41b is placed on the second surface 13b as the additional photomask so as to form a second exposed pattern of the photoresist layer 30b on the second and third surfaces 13b and 15b. Consequently, it is possible to form the exposed pattern of the photoresist layer 30b consisting of the first and second exposed patterns precisely on the substrate 10b, while reducing the influence of diffraction. The threshold distance is determined in response to the accuracy of a desired circuit pattern. A light-transmissive pattern 42b of the photomask 40b is configured in accordance with the same manner as the first embodiment. If necessary, it is preferred that a light-transmissive pattern 43b of the additional photomask 41b is configured in the same manner as that of the photomask 40b.

Figure 4E:
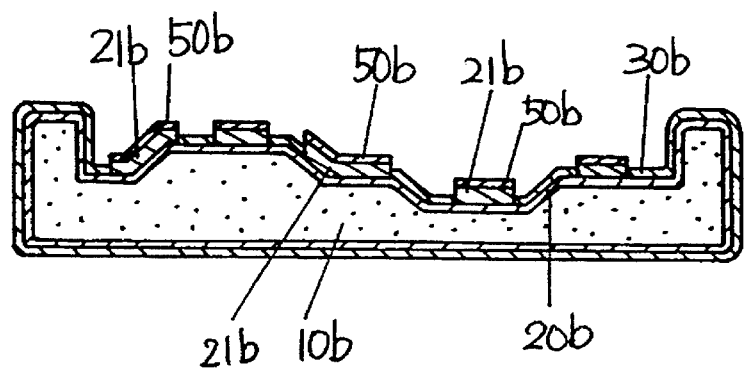
Figure 4F:
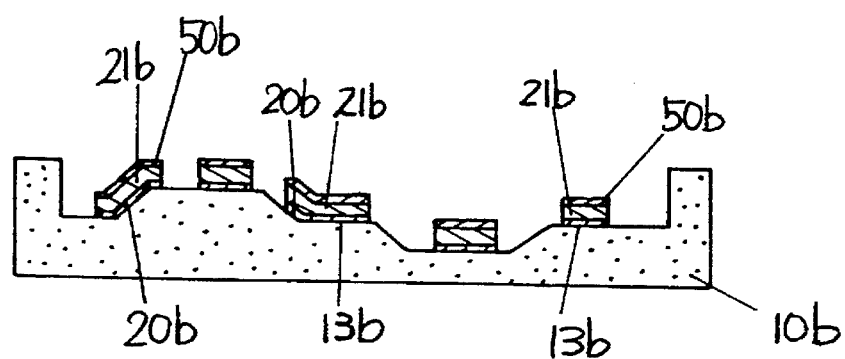
Figure 4G:
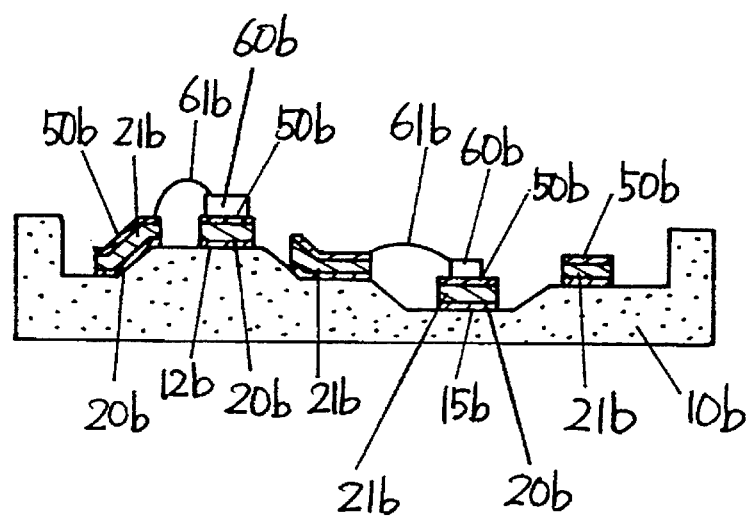

After the radiation of the parallel light beam, the photoresist layer 30b of the exposed area is removed to leave a patterned area of the copper layer 20b without the photoresist layer. A circuit pattern consisting of a gold layer (not shown), a nickel layer 50b, an additional copper layer 21b and the copper layer 20b is formed on the substrate 10b in accordance with the substantially same steps as the first embodiment, as shown in FIGS. 4E and 4F. Electrical components 60b such as a LSI, etc., are mounted on the substrate 10b or the gold layer, and connected to a required circuit pattern by a wire-bonding 61b of gold, as shown in FIG. 4G.

Figure 5:
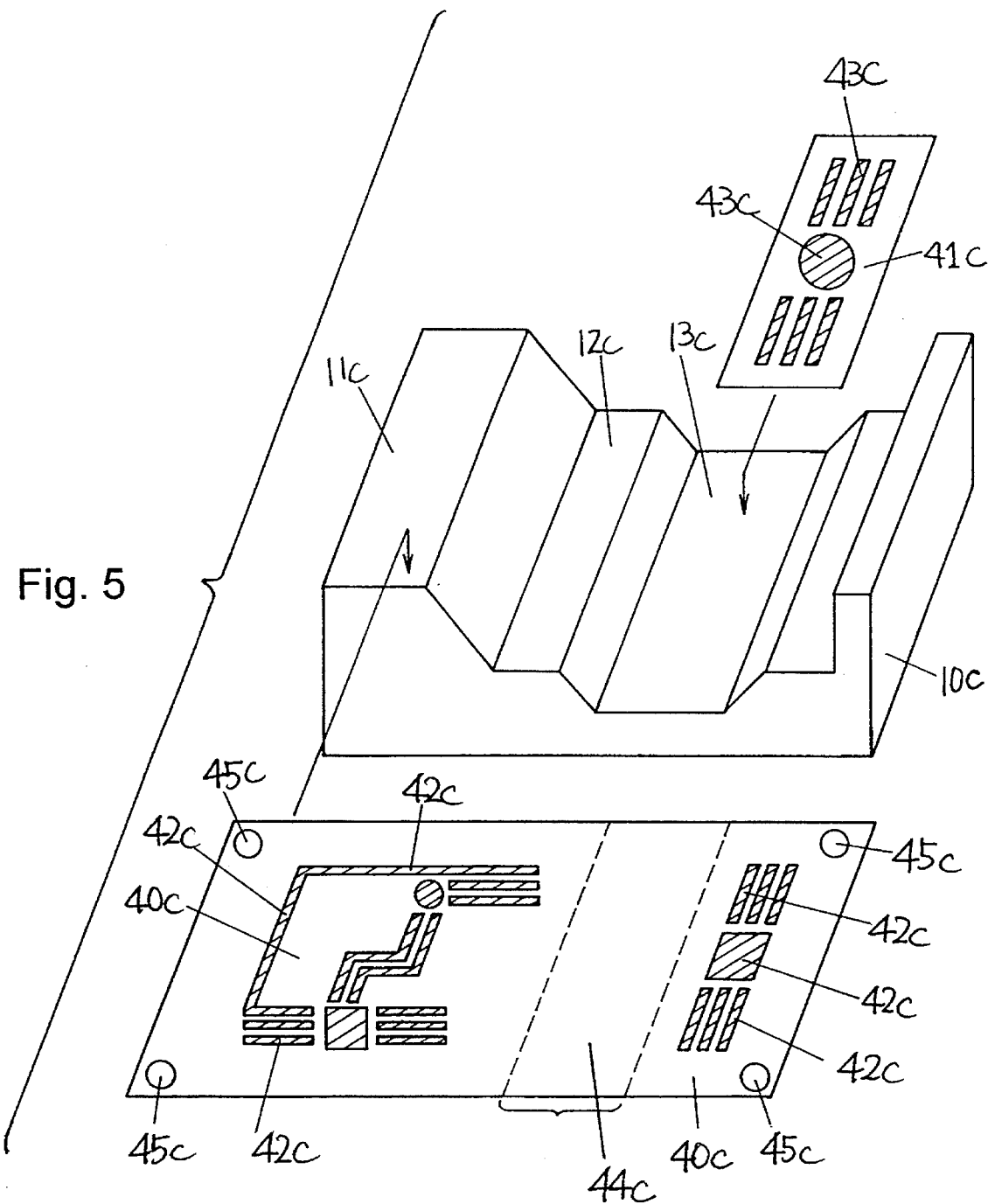
FIG. 5 is perspective views of large and small photomask and a three-dimensionally molded substrate used in a modification of the second embodiment.
Figure 6:
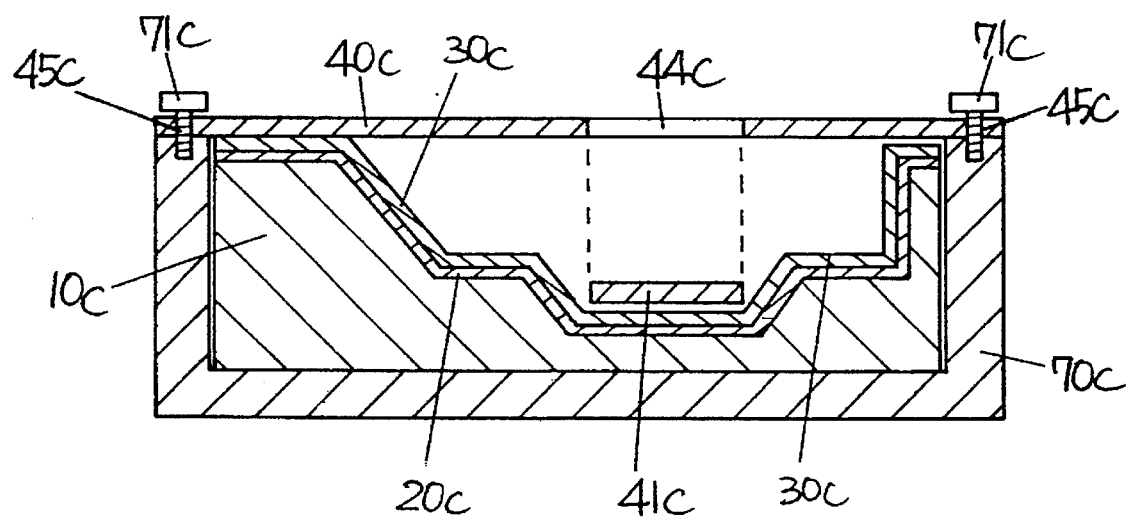
FIG. 6 is a cross sectional view for understanding a way of fixing the large and small photomasks in front of the substrate disposed in a case.

In a first modification of the second embodiment, it is possible to use large and small planar photomasks 40c and 41c in order to precisely form an exposed pattern of a photoresist layer 30c on a three-dimensionally molded substrate 10c having an irregular surface, as shown in FIG. 5. The irregular surface is composed of a first surface 11c higher than a second surface 12c and a third surface 13c lower than the second surface 12c. After a conductive layer 20c and the photoresist layer 30c is formed on the irregular surface, the substrate 10c is disposed in a rectangular case 70c having a top opening, the large photomask 40c is fixed to the case 70c at the respective corner through-holes 45c thereof by means of screws 71c, as shown in FIG. 6. Since a distance between the large photomask 70c and the photoresist layer 30c on the third surface 13c is more than a threshold distance, the small photomask 41c is placed just in front of the photoresist layer 30c on the third floor 13c. Light-transmissive patterns 42c and 43c of the large and small photomasks 40c and 40c are configured in accordance with the same manner as the first embodiment. The large photomask 40c has a window portion 44c, which is the same area as the small photomask 41c and used for transmitting a parallel light beam to the small photomask 41c. The small photomask 41c can be also fixed in the case 70c.

Figure 7A:
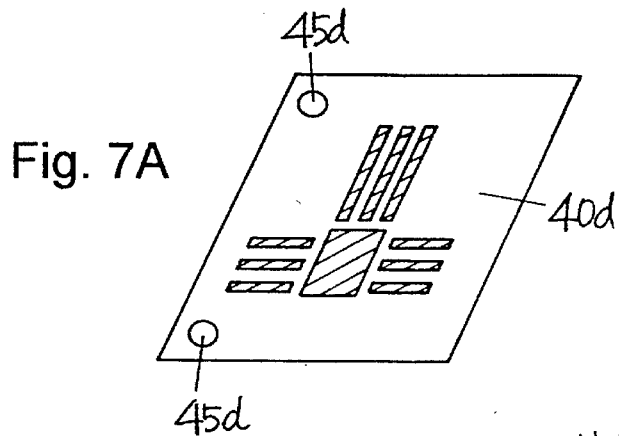
FIGS. 7A to 7C are perspective views for understanding a way of fixing a photomask directly on a substrate.
Figure 7B:
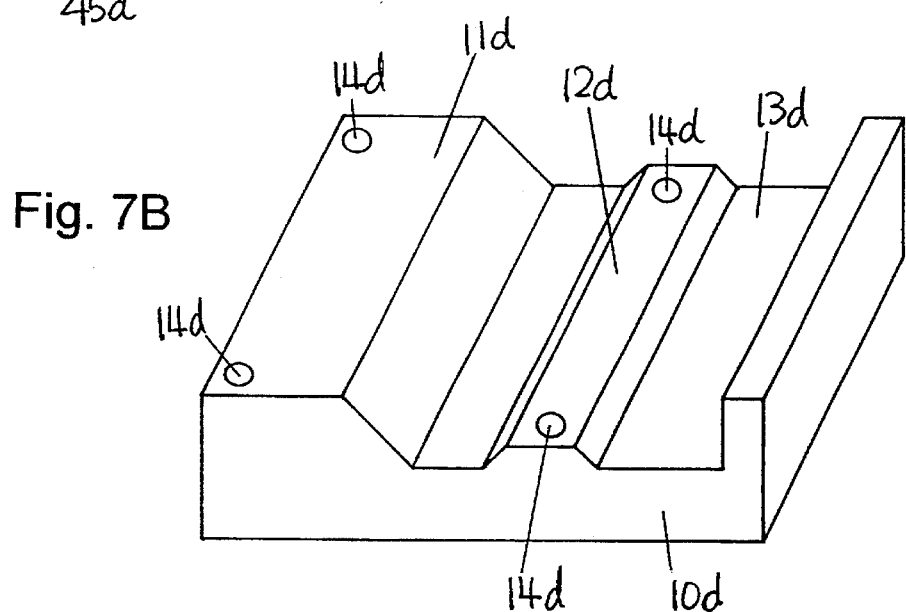
Figure 7C:
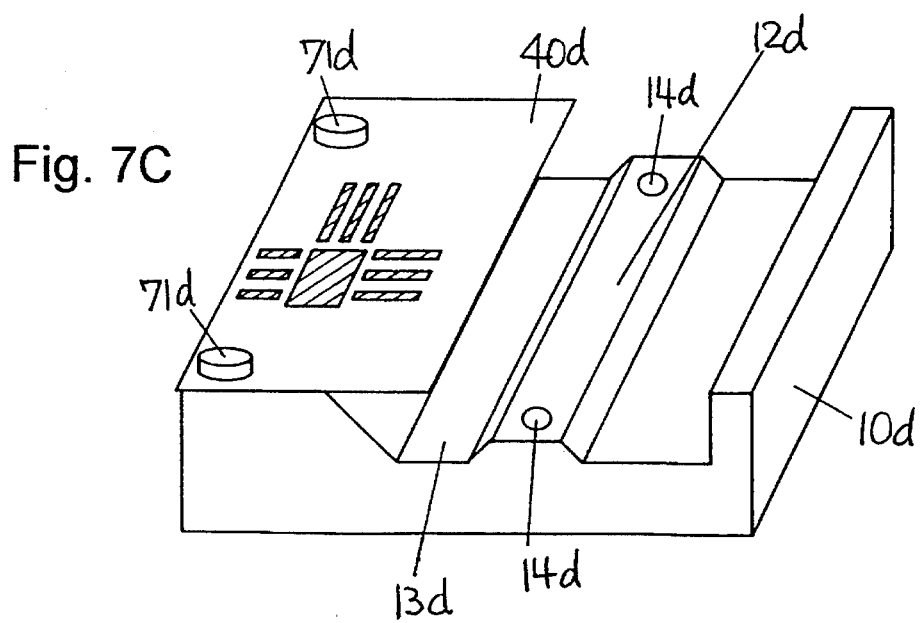
Figure 8A:
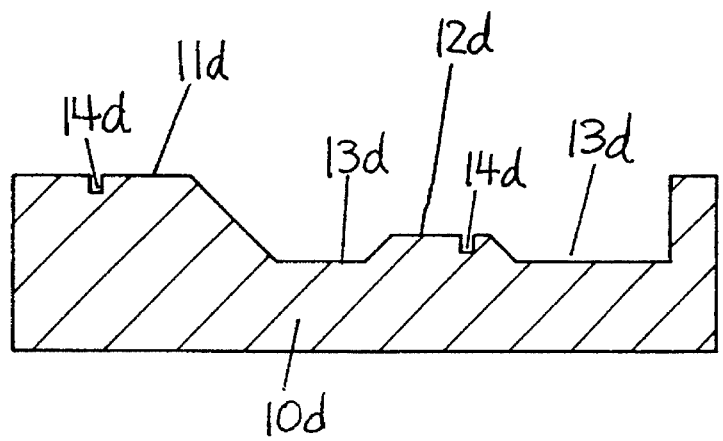
FIGS. 8A to 8C are cross-sectional views illustrating the way shown in FIGS. 7A to 7C.
Figure 8B:
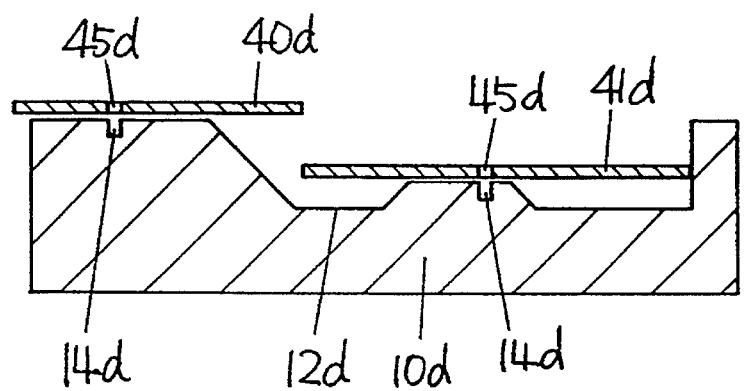
Figure 8C:
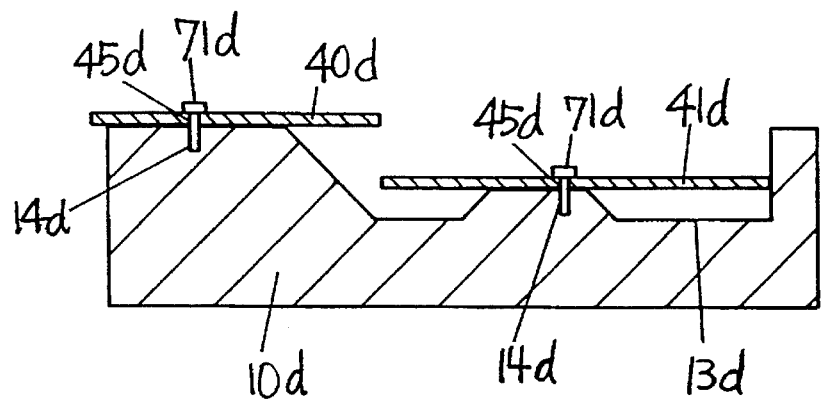

By the way, it is possible to fix a photomask to a substrate or case by means of any one of fixtures shown in FIGS. 7A to 10. For example, as shown in FIGS. 7B and 8A, a three-dimensionally molded substrate 10d is formed with a first surface 11d, a second surface 12d lower than the first surface 11d, a third surface 13d lower than the second surface 12d and positioning holes 14d in the first and second surfaces. The diameter and depth of each positioning hole 14d are, e.g., 2 mm and 3 mm, respectively. Since a distance between the first surface 11d and third surface 13d is larger than a predetermined threshold distance, two planar photomasks 40d and 41d are used in this case. The photomasks have through-holes 45d, as shown in FIG. 7A, each of which is the substantially same diameter as the positioning hole 14d. The photomasks 40d and 41d are set respectively to the first and second surfaces 11d and 12d, as shown in FIG. 8B, and then pins 71d are inserted to the through-holes 45d of each photomask and the positioning holes 14d to fix the photomasks 40d and 41d to the substrate 10d, as shown in FIGS. 7C and 8C.

Figure 9A:
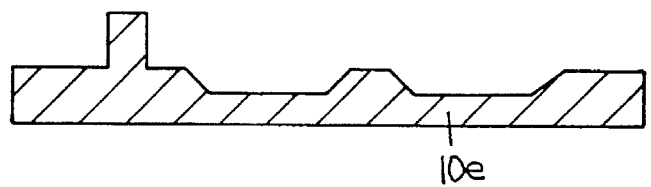
FIGS. 9A to 9E illustrate a way of fixing two photomasks in front of a substrate disposed in a case.
Figure 9B:
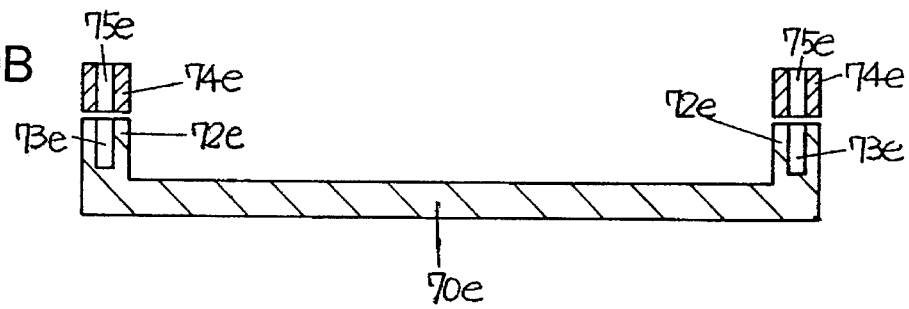
Figure 9C:
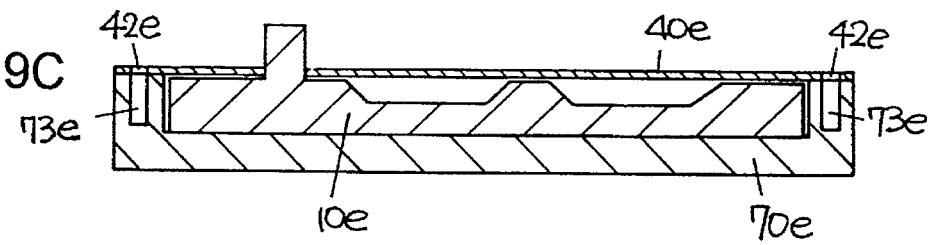
Figure 9D:
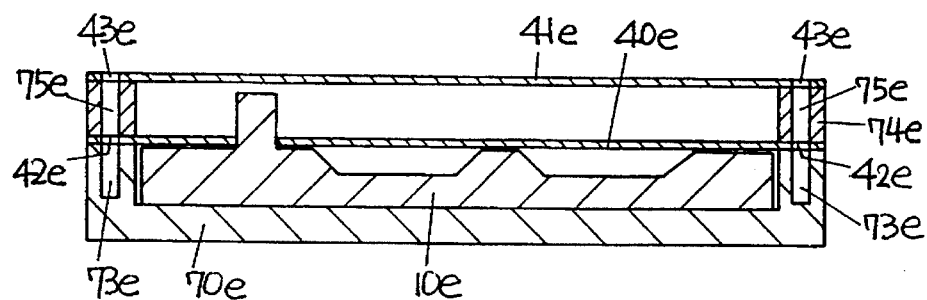
Figure 9E:
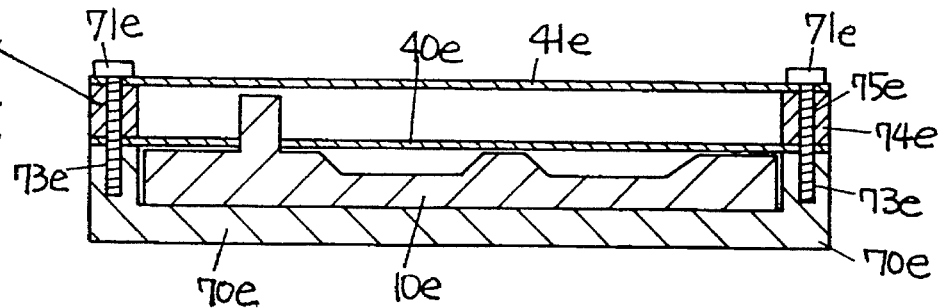

In addition, FIGS. 9A to 9E shows a method of fixing upper and lower photomasks 41e and 40e to a case 70e. The case 70e is formed with a top opening, side wall 72e and positioning holes 73e in the side wall 72e, as shown in FIG. 9B. A three-dimensionally molded substrate 10e having the cross section of FIG. 9A is disposed in the case 70e. The lower photomask 40e is placed on the side wall 72e such that first through-holes 42e of the lower photomask 40e are fitted to the positioning holes 73e of the case 70e, as shown in FIG. 9C. The upper photomask 41e is placed above the lower photomask 40e through cylindrical spacers 74e such that second through-holes 43e of the upper photomask 41e are fitted to the first through-holes 42e and through-holes 75e of the spacers 74e, as shown in FIG. 9D. Subsequently, the spacers 74e and the upper and lower photomasks 41e and 40e are fixed to the case 70e by means of bolts 71e, as shown in FIG. 9E.

Moreover, FIGS. 10A and 10B show another fixture used in the present invention. That is, a three-dimensionally molded substrate 10f is formed with a first surface 11f and a second surface 12f lower than the first surface 11f, and a rectangular projection 13f on the first surface 11f. Since a distance between a planner photomask 40f and the second surface 12f is less than a predetermined threshold distance, only one planar photomask 40f is used in this case. The photomask 40f is provided with a center through-hole 45f which is slightly larger than the cross section of the projection 13f, as shown in FIG. 10B. Reinforcing members 75f are attached to the photomask 40f at the circumference of the center through-hole 45f for preventing a breakage of the photomask 40f when fixing it to the substrate 10f. The photomask 40f is fixed to the substrate 10f by fitting the center through-hole 45f to the projection 13f, as shown in FIG. 10B.

Figure 11A:
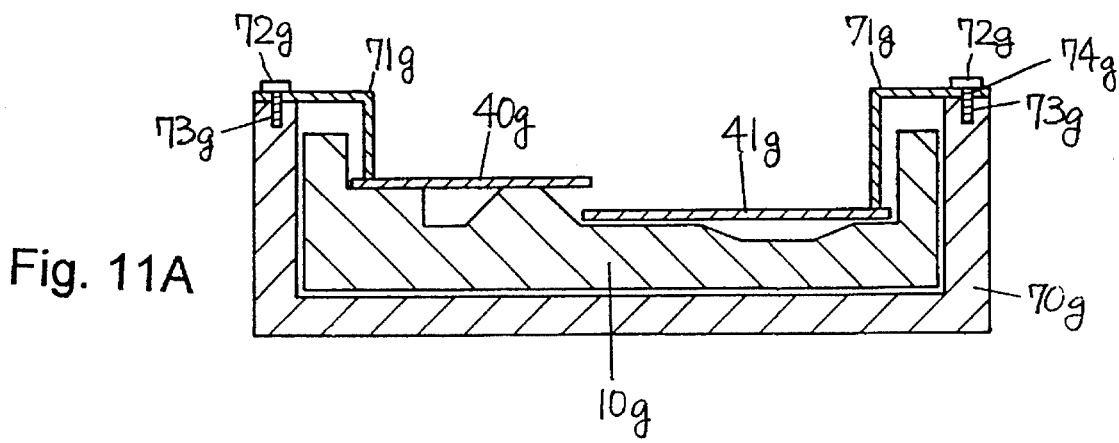
FIGS. 11A and 11D illustrate a way of fixing two photomasks in front of a substrate with the use of a supporting rod.
Figure 11B:
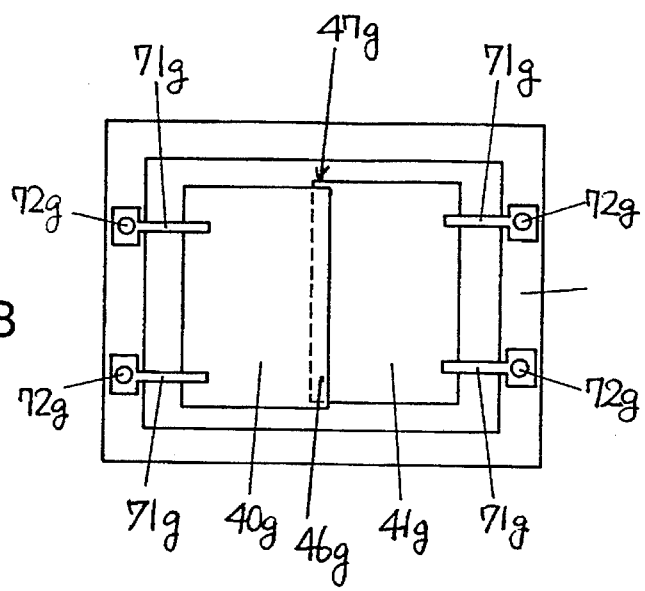
Figure 11C:
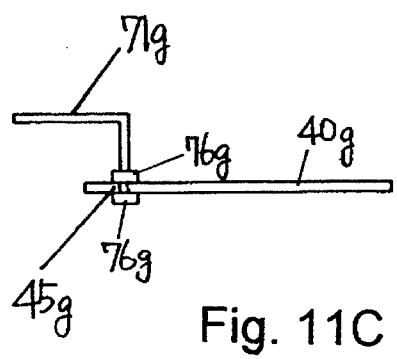
Figure 11D:
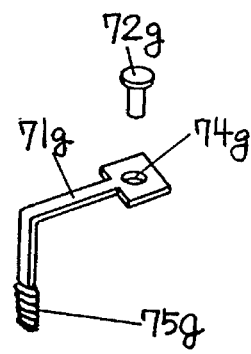

FIGS. 11A to 11D show another fixture used in the present invention. When a three-dimensionally molded substrate 10g having the cross section shown in FIG. 11A is disposed in a case 70g, two planar photomasks 40g and 41g are respectively fixed to the case 70g by means of at least one L-shaped rod 71g as a supporting rod. That is, the L-shaped rod 71g has a screw portion 75g formed at one end thereof, and a through-hole 74g formed in the other end, as shown in FIG. 11D. For example, the L-shaped rod 71g is connected to the photomask 40g by inserting the screw portion 75g into a thorough-hole 45g of the photomask 40g, and then fixing the screw portion 75g to the photomask 40g with the use of nuts 76g, as shown in FIG. 11C. On the other hand, the L-shaped rod 71g is fixed to the case 70g by inserting a pin 72g into a positioning hole 73g of the case 70g through the through-hole 74g thereof, as shown in FIGS. 11A and 11B. Marginal portions 46g and 47g of the photomasks 40g and 41g are overlapped with each other with respect to a radiating direction of a parallel light beam to the photomasks, as shown in FIG. 11B.

Figure 12A:
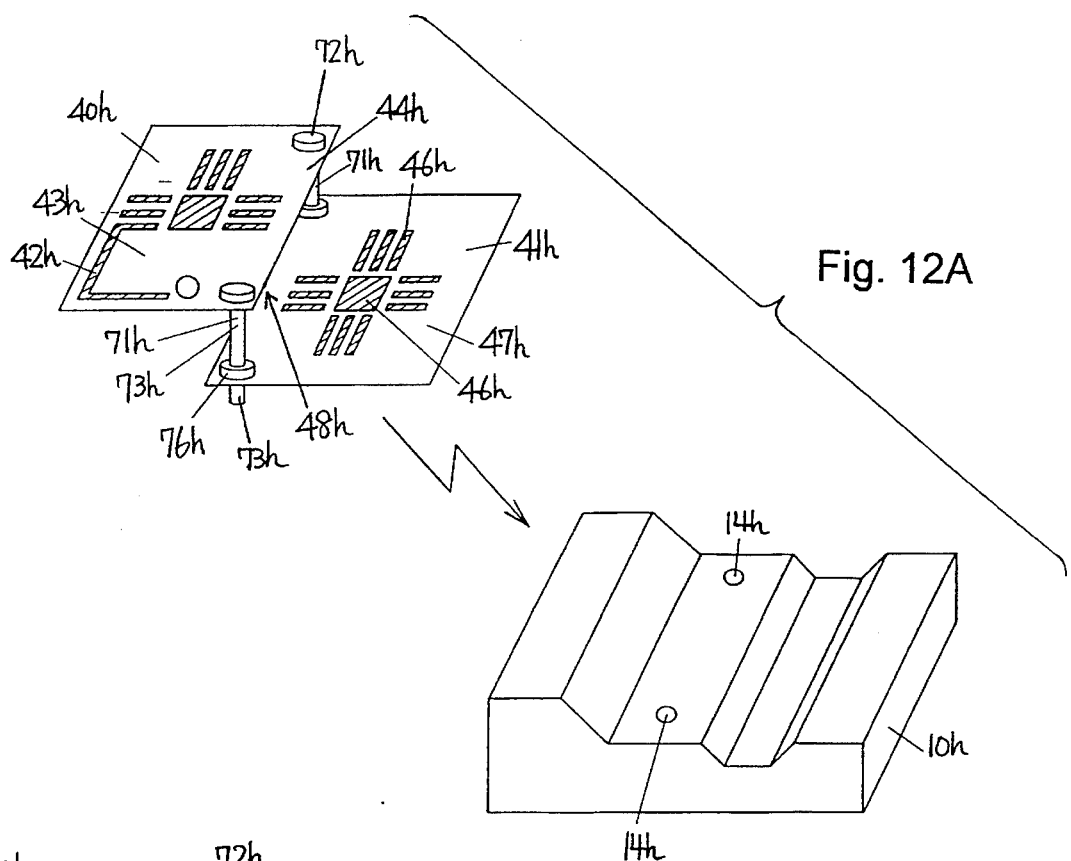
FIGS. 12A and 12B illustrate a way of fixing photomasks in front of a substrate with the use of a joint rod.
Figure 12B:
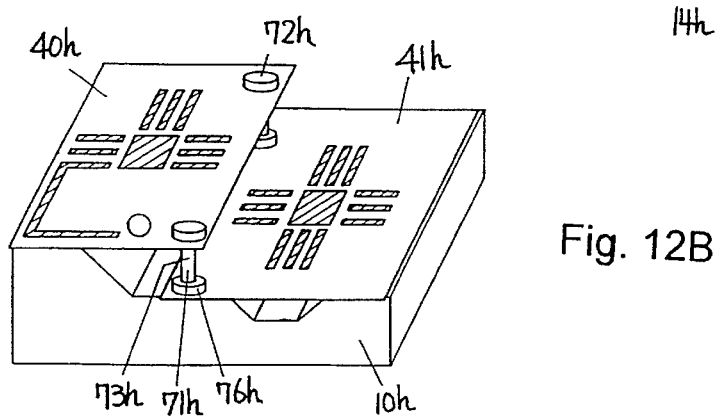
Figure 13:
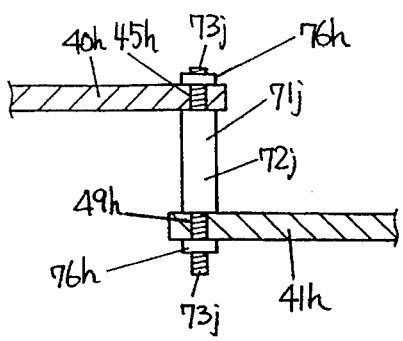
FIG. 13 shows a structure of another joint rod fixed to photomasks.

FIGS. 12A, 12B and 13 show another fixtures used in the present invention. Two planar photomasks 40h and 41h are used in this case. The upper photomask 40h is provided with a light-transmissive pattern 42h, a mask pattern 43h, a margin 44h and at least one through-hole 45h formed in the margin 44h. The lower photomask 41h is provided with a light-transmissive pattern 46h, a mask pattern 47h, a margin 48h and, at least one through-hole 49h formed in the margin 48h. The margins 44h and 48h are overlapped each other with respect to a radiating direction of a parallel light beam to the photomasks. The overlapped margins 44h and 48h are linked by means of at least one joint rod 71h passing through the through-holes 45h and 49h, as shown in FIG. 12A. The joint rod 71h is in the form of a bolt having a bolt head 72h and a screw shaft 73h. The photomasks 40h and 41h are fixed to the screw shaft 73h of the joint rod 71h with the use of nuts 76h, respectively. The screw shaft 73h projecting from the through-hole 49h of the lower photomask 41h is inserted into a positioning hole 14h of a three dimensionally molded substrate 10h to place the photomasks 40h and 41h in front of the substrate 10h, as shown in FIG. 12B.

It is possible to use a joint rod 71j in place of the above explained joint rod 71h. The joint rod 71j is formed with a shaft 72j, screw portions 73j extending from both ends of the shaft 72j, as shown in FIG. 13. After the screw portions 73j are inserted into the through-holes 45h and 49h, the photomasks 40h and 41h are fixed to the joint rod 71j with the use of the nuts 76h.

[Third Embodiment]

In case of radiating a parallel light beam at once to upper and lower photomasks placed in front of a photoresist layer to form an exposed pattern of the photoresist layer, when margins of the photomasks are not overlapped each other with respect to the radiating direction, the parallel light beam is diffracted at the margin end of the upper photomask, so that there causes a problem of exposing the photoresist layer of the undesired area adjacent to the margin end of the lower photomask. Therefore, when a plurality of photomasks are applied, it is preferred that margins of the adjacent photomasks are overlapped each other. However, in case of forming a fine and densely exposed pattern of the photoresist layer, there causes another problem that it is difficult to provide a required exposure amount to the photoresist layer lying under the overlapped margins of the adjacent photomasks.

In this embodiment, the fine and densely exposed pattern of the photoresist layer is formed by repeating a radiation of the parallel light beam in such a manner that when the parallel light beam is radiated to one of the photomasks placed in front of the photoresist layer, the rest of photomasks are shielded by means of a blind mask.

Figure 14A:
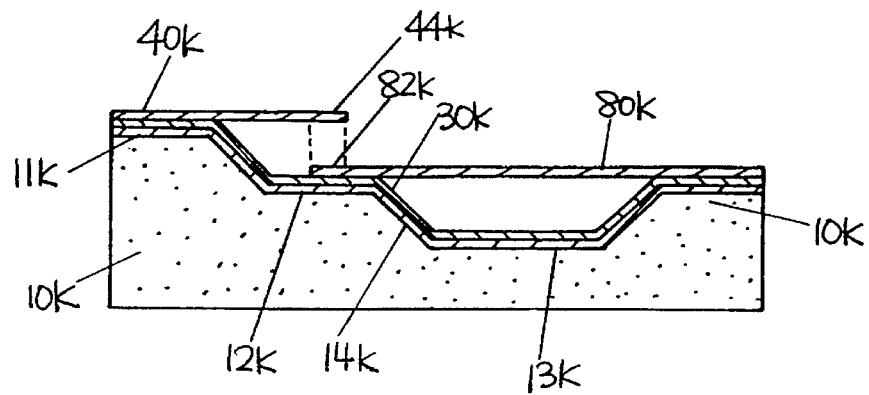
FIGS. 14A to 14F illustrate an exposing step of a photoresist layer of a third embodiment of the present invention.
Figure 14B:
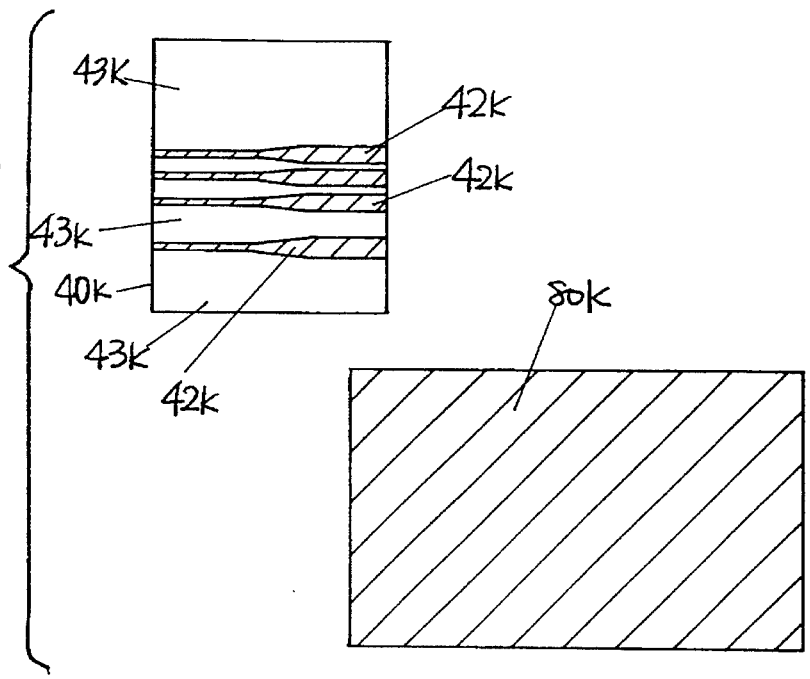
Figure 14C:
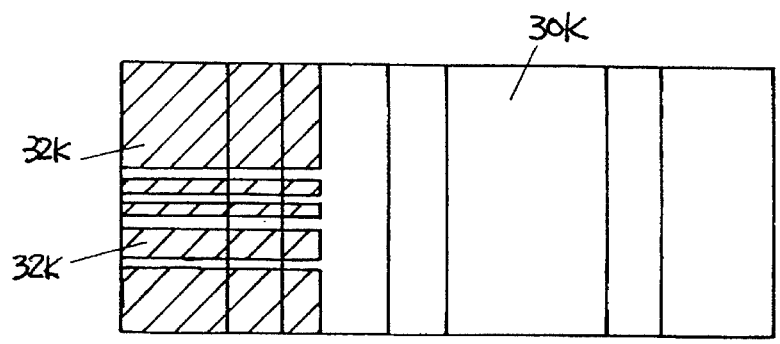
Figure 14D:
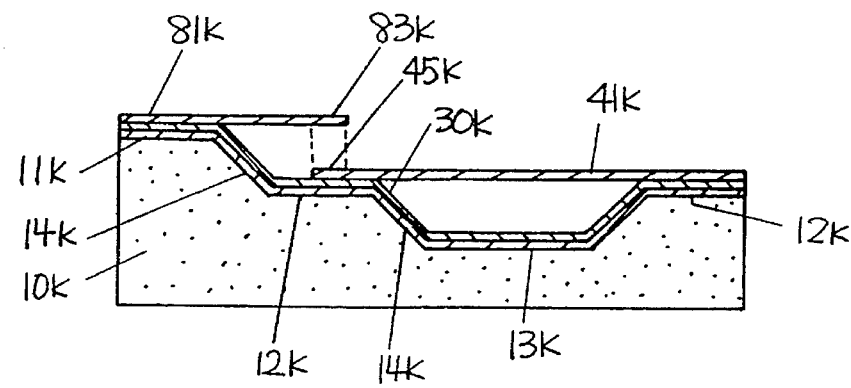
Figure 14E:
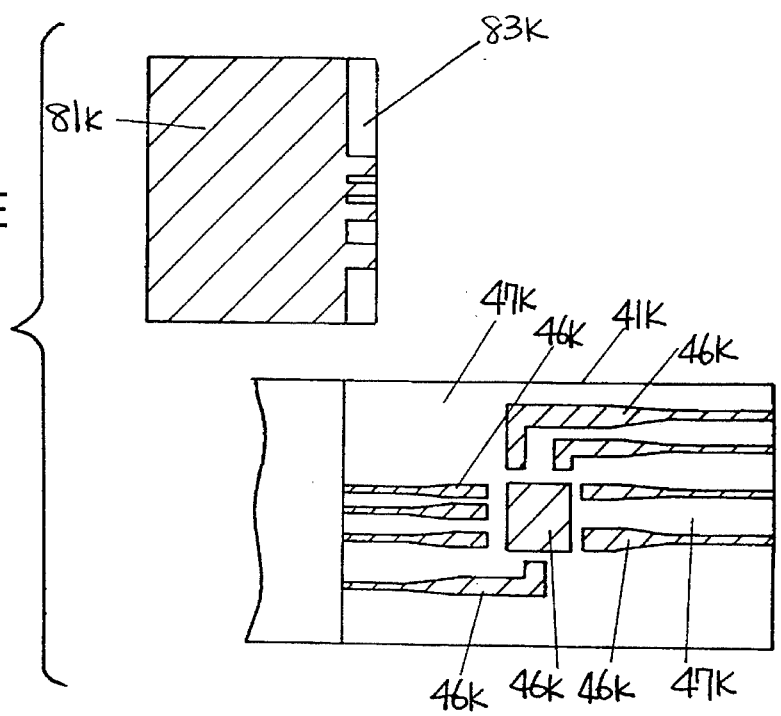
Figure 14F:
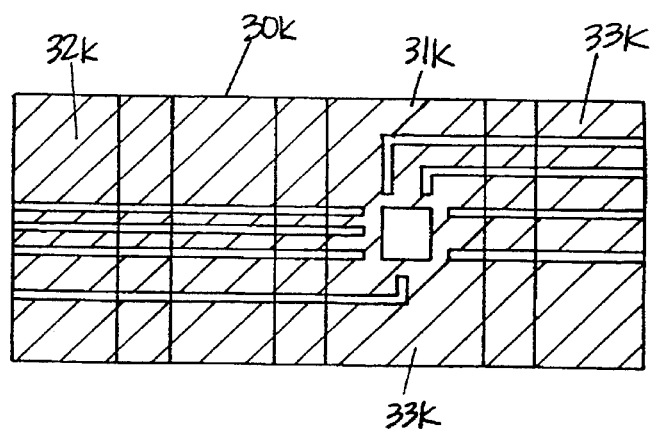

For example, a method of forming a fine and densely exposed pattern 31k of a photoresist layer 30k is explained below. The photoresist layer 30k is formed on a three-dimensionally molded substrate 10k having the cross section shown in FIG. 14A. The cross section comprises a top surface 11k, an intermediate surface 12k, a bottom surface 13k, and slopes 14k extending between the adjacent surfaces. A first radiation of a parallel light beam to a first planar photomask 40k placed on the top surface 11k is performed to give a first exposed pattern 32k to an area of the photoresist layer 30k, as shown in FIG. 14C. In this time, a first blind mask 80k is placed on the intermediate surface 12k to shield the remaining area of the photoresist layer 30k. FIG. 14B shows the first photomask 40k and the first blind mask 80k. The first photomask 40k comprises a mask pattern 42k and a light transmissive pattern 43k configured in accordance with the present manner. A margin 44k of the first photomask 40k is overlapped with a margin 82k of the first blind mask 80k for preventing undesired exposure of the photoresist layer 30k caused by the parallel light beam diffracted at an end of the margin 44k of the first photomask 40k. After the first radiation, a second radiation of the parallel light beam to a second planar photomask 41k placed on the intermediate surface 12k is performed to give a second exposed pattern 33k to the remaining area of the photoresist layer 30k. In the second radiation, a second blind mask 81k is placed on the top surface 11k to shield the first exposed pattern 32k, as shown in FIG. 14D. FIG. 14E shows the second photomask 41k and the second blind mask 81k. The second photomask 41k comprises a mask pattern 46k and a light transmissive pattern 47k configured in accordances with the present manner. A margin 83k of the second blind mask 81k, which is the same pattern as the margin 44k of the first photomask 40k, is overlapped with a margin 45k of the second photomask 41k for provide a required exposure amount to the photoresist layer 30k lying under the overlapped margins 83k and 45k, as shown in FIG. 14E. Consequently, the whole exposed pattern 31k consisting of the first and second exposed patterns 32k and 33k is formed on the photoresist layer 30k, as shown in FIG. 14F. A width of overlapped margins of adjacent photomasks is determined in accordance with a parallelism of parallel light beam and an elevation difference between the adjacent photomasks. In addition, in place of the use of a plurality of photomasks, it is possible to bend a planar photomask so as to form a plurality of photomask surfaces at varying elevations.

[Fourth Embodiment]

In this embodiment, a light-absorption material 43m is coated on a mask pattern 42m of a planar photomask 40m. A method of forming the mask pattern 42m is explained below. A photoresist material 35m such as a positive-type dry film is coated on one side of the photomask 40m comprising a light-transmissive pattern 41m and the mask pattern 42m, as shown in FIG. 15A. A light beam 1m such as ultraviolet is radiated to photoresist material 35m from the other side of the photomask 40m to form an exposed pattern of the photoresist material 35m corresponding to the light-transmissive pattern 41m, as shown in FIG. 15B. The photoresist material 35m of a non-exposed pattern is removed from the photomask 40m, as shown in FIG. 15C. The light absorbing material 43m such as a carbon is sprayed on the photomask 40m, as shown in FIG. 15D, and then the rest of photoresist material 35m is removed to obtain the photomask 40m which is provided with the light-absorption material 43m on the mask pattern 42m, as shown in FIG. 15E.

Figure 16:
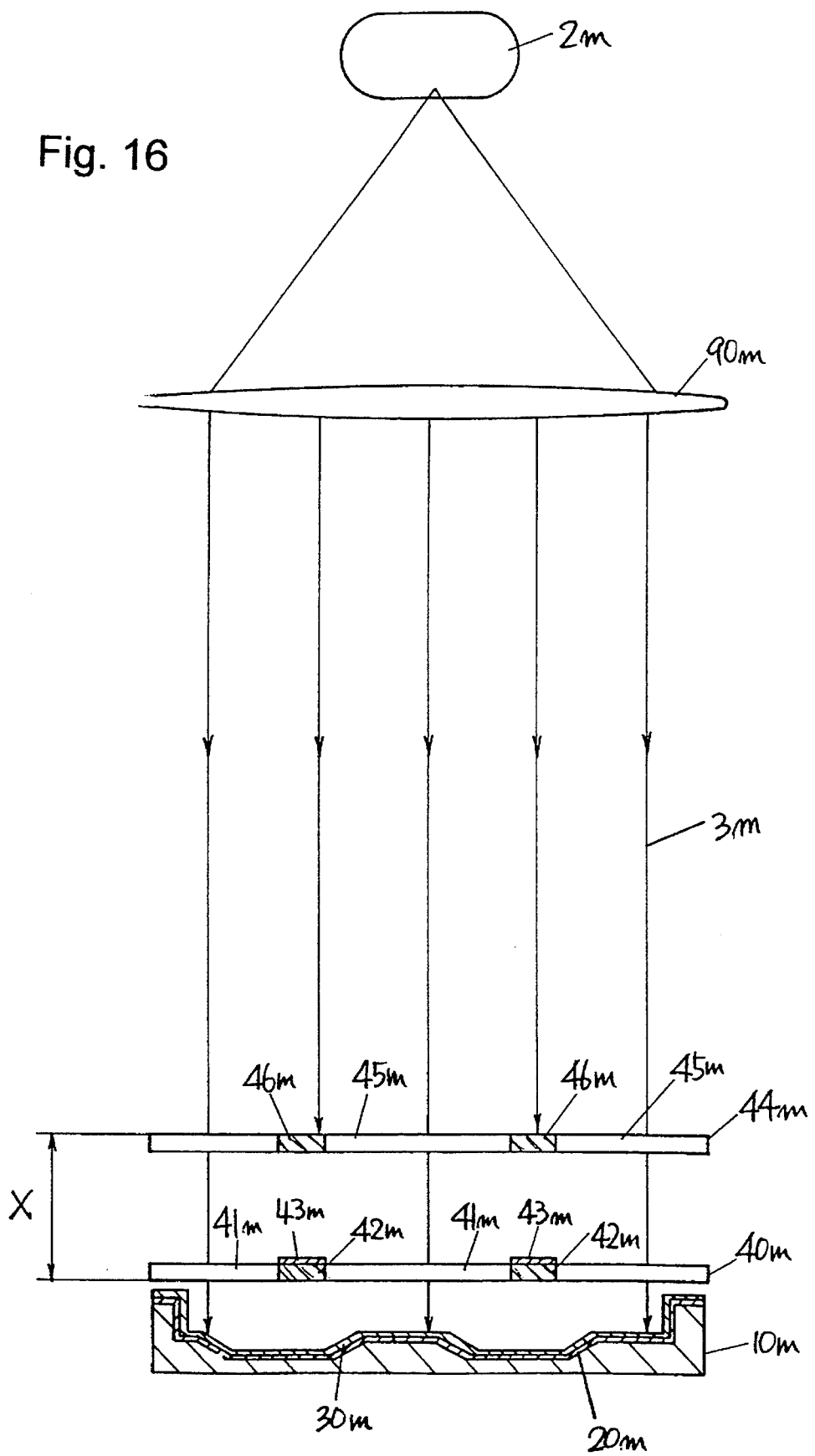
FIG. 16 shows an exposing step of a photoresist layer with the use of the photomask of FIG. 15E.

For example, as shown in FIG. 16, thus obtained photomask 40m is placed as a lower photomask in front of a photoresist layer such that a parallel light beam 3m is radiated to the light-absorption material 43m of the photomask 40m. The photoresist layer 30m is formed on a three-dimensionally molded substrate 10m through a conductive layer 20m. In addition, an auxiliary photomask 44m having the same mask pattern as the lower photomask and without the light-absorption material 43m is arranged as an upper photomask above the lower photomask such that the mask pattern 46m of the upper photomask 44m is completely overlapped with the mask pattern 42m of the lower photomask 40m with respect to a radiating direction of the parallel light beam 3m, as shown in FIG. 16. The parallel light beam 3m supplied from a light source 2m is radiated to the upper photomask 44m through an optical lens 90m. Though the parallel light beam 2m is diffracted at a light transmissive pattern 45m of the upper photomask 44m, it is efficiently absorbed by the light-absorption material 43m on the mask pattern 42m of the lower photomask 40m. Consequently, it is possible to precisely form an exposed pattern of the photoresist layer 30m, while preventing undesired exposures of the photoresist layer.

By the way, it should be considered from the viewpoint of a precise formation of the exposed pattern that a parallelism of the parallel light beam 3m is more improved as a distance "X" between the upper and lower photomasks 40m and 44m increases. Of course, it is also possible to use two planar photomasks without the light-absorption material 43m.

Figure 17A:
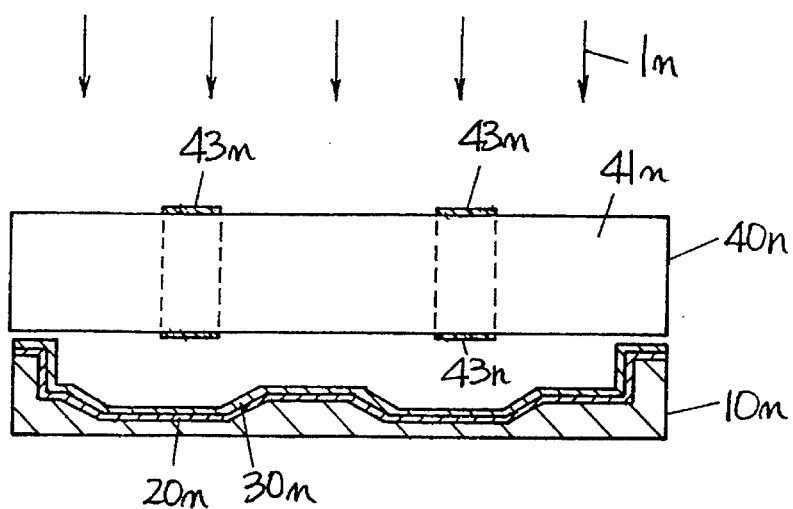
FIGS. 17A and 17B illustrate an exposing step of a photoresist layer with the use of another photomask as a modification of the fourth embodiment.
Figure 17B:
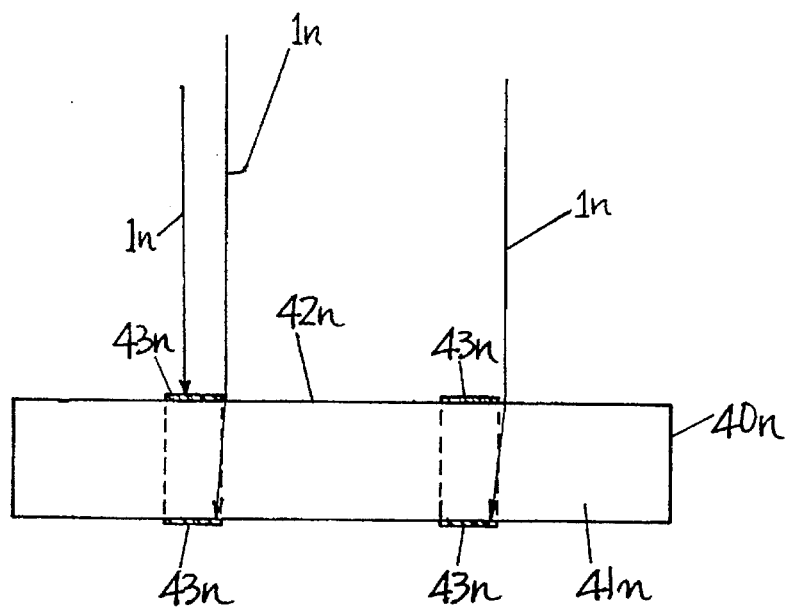

As a modification of this embodiment, a photomask 40n is placed in front of a photoresist layer 30n which is formed on a three-dimensionally molded substrate 10n through a conductive layer 20n. The photomask 40n is formed with a light-transmissive plate 41n and two same mask patterns 43n made of a light-absorption material. The mask patterns 43n are formed on the opposite surfaces of the light-transmissive plate 41n such that one of the mask patterns 43n is completely overlapped with the other one with respect to a radiating direction of a parallel light beam in. When the parallel light beam 1n is radiated to the photomask 40n, as shown in FIG. 17A, the parallel light beam in diffracted at a light transmissive pattern 42n of the upper surface of the photomask 40n is efficiently absorbed by the mask pattern 43n on the lower surface of the photomask 40n, as shown in FIG. 17B. It should be considered from the viewpoint of a precise formation of an exposed pattern that a parallelism of the parallel light beam 1n is more improved as a thickness of the light transmissive plate 41n increases.

The photomask 40n is readily manufactured according to the following steps. A pattern of a photoresist material such as a dry film is formed on the opposite surfaces of a thick light-transmissive plate 41n. Then, the light-absorption material such as a carbon is sprayed on the opposite surfaces, and the photoresist material is removed to obtain the mask pattern 43n on the opposite surfaces of the light-transmissive plate 41n.

Figure 18:
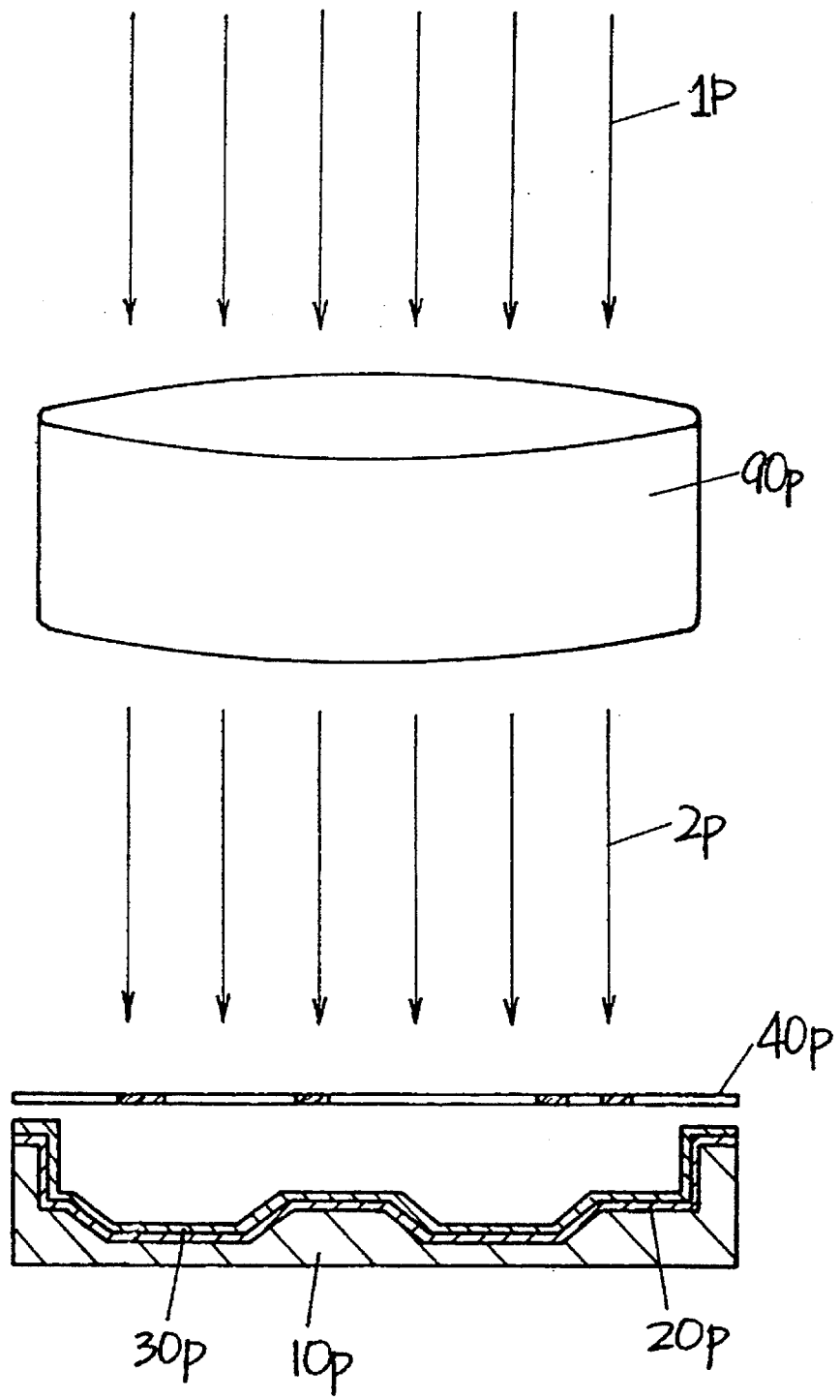
FIG. 18 shows an exposing step of a photoresist layer with the use of a collimator.

In the above embodiments, it is preferred to use a collimator for providing a parallel light beam. As shown in FIG. 18, when a first parallel light beam 1p is directed to a collimator 90p, non-parallel light beams included in the parallel light beam 1p are reflected by the collimator 90p, so that a secondary parallel light beam 2p having an improved parallelism thereof can be radiated to a photomask 40p placed in front of a photoresist layer 30p. The photoresist layer 30p is formed on a three-dimensionally molded substrate 10p through a conductive layer 20p. The parallel light beam 1p is given by focusing a light supplied from a mercury lamp (not shown) by means of an optical mirror (not shown), and letting the focused light pass through an optical lens (not shown). Previously available regular collimators may be used as well as the above explained collimator 90p. In particular, it is preferred to radiate the parallel light beam 2p to the photomask 40p while rotating the collimator 90p on a plane perpendicular to the radiating direction for providing an uniform exposure amount.

Figure 19:
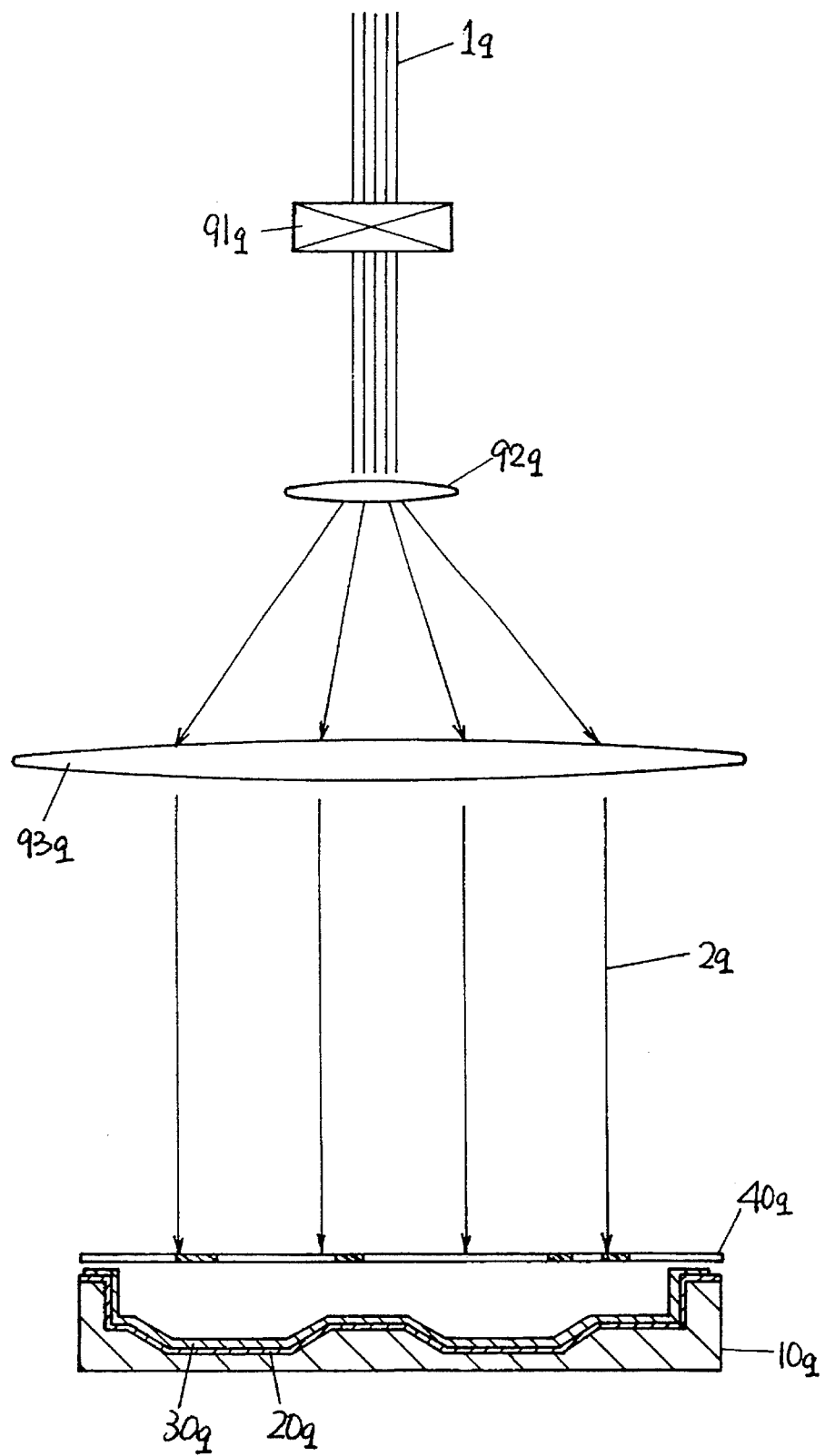
FIG. 19 shows an exposing step of a photoresist layer with the use of a laser beam and optical lens.

In addition, it is preferred that a parallel light beam is provided by widening a laser beam with the use of optical lenses. For example, an argon (Ar) laser beam 1q having the wave length of 360 nano-meter is used. The Ar laser beam 1q is sent to a filter 91q for supplying an uniform output-strength thereof. The Ar laser beam 1q from the filter 91q is widened by a first optical lens 92q, and then converted to a parallel light beam 2q by letting thus widened laser beam 1q pass through a second optical lens 93q, as shown in FIG. 19. The parallel light beam 2q is radiated to a photomask 40q placed in front of a photoresist layer 30q. The Photoresist layer 30q is formed on a three-dimensionally molded substrate 10q through a conductive layer 20q.

Figure 20:
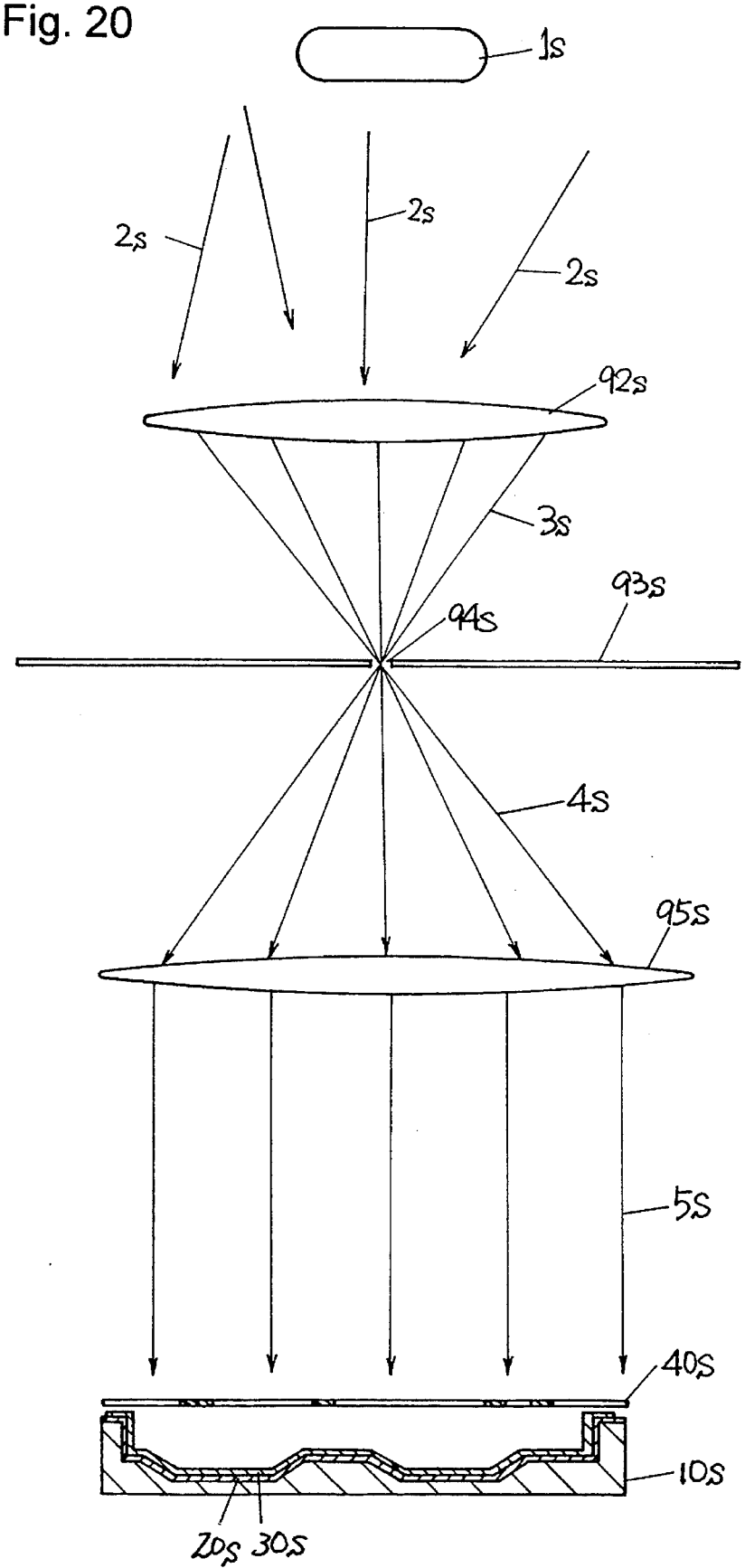
FIG. 20 shows an exposing step of a photoresist layer with the use of a light beam passing through a pin-hole.

Moreover, it is possible to use a parallel light beam provided by widening a light passing through a pin hole with the use of an optical lens. For example, as shown in FIG. 20, a scattering light 2s is provided from a mercury lamp 1s. The scattering light 2s is focused with a first optical lens 92s. Thus focused light 3s is directed to a pin-hole 94s of a shield 93s. A distance between the pin-hole 94s and the first optical lens 92s is substantially equal to a focal length of the first optical lens 92s. A light beam 4s passing through the pin-hole 94s is directed to a second optical lens 95s to convert the light beam 4s to a parallel light beam 5s. A distance between the pin-hole 94s and the second optical lens 95s is substantially equal to a focal length of the second optical lens 95s. The parallel light beam 5s is radiated to a photomask 40s placed in front of a photoresist layer 30s. The photoresist layer 30s is formed on a three-dimensionally molded substrate 10s through a conductive layer 20s.

Figure 21:
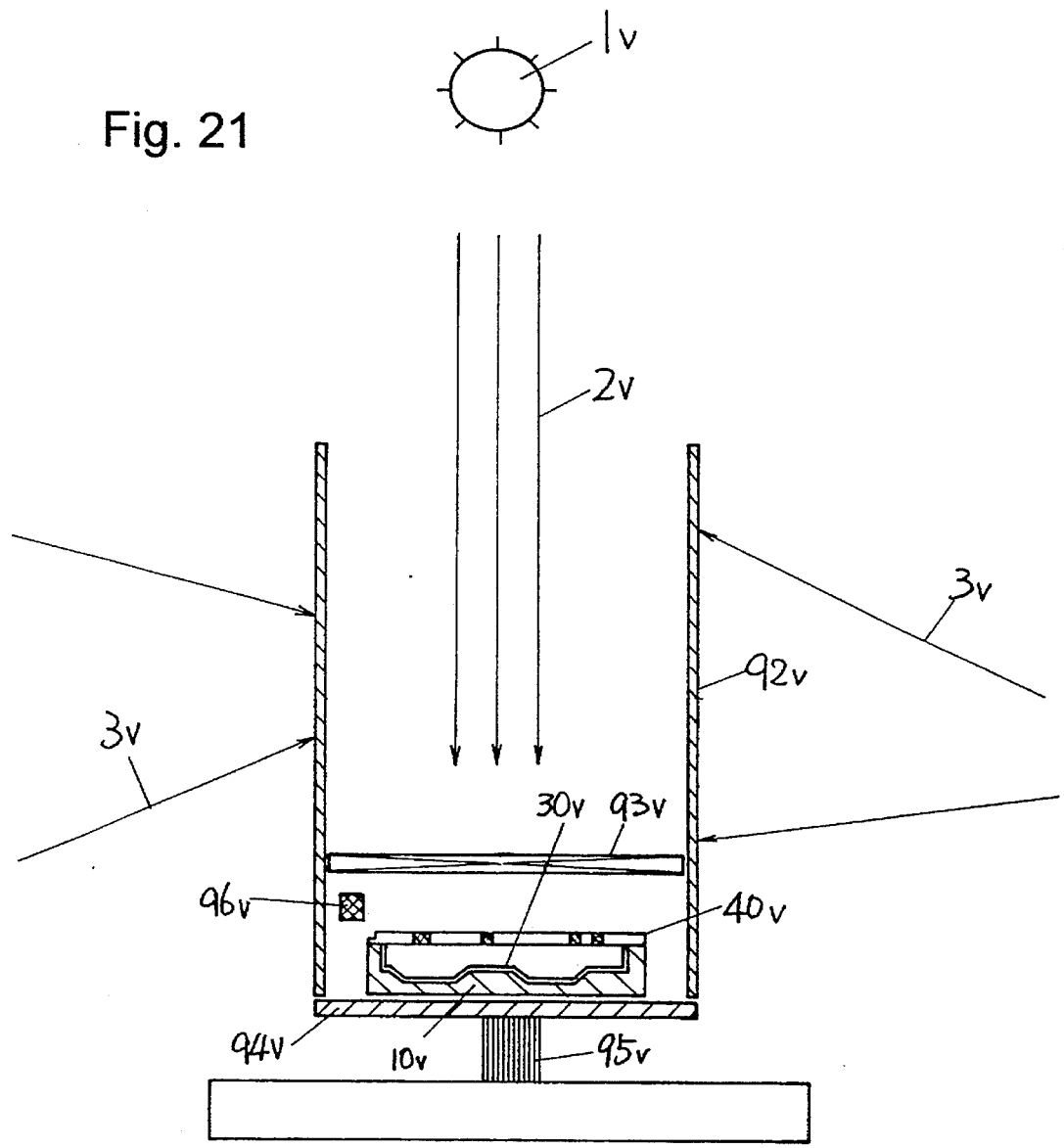
FIG. 21 shows an exposing step of a photoresist layer with the use of the sunlight.
Figure 22:
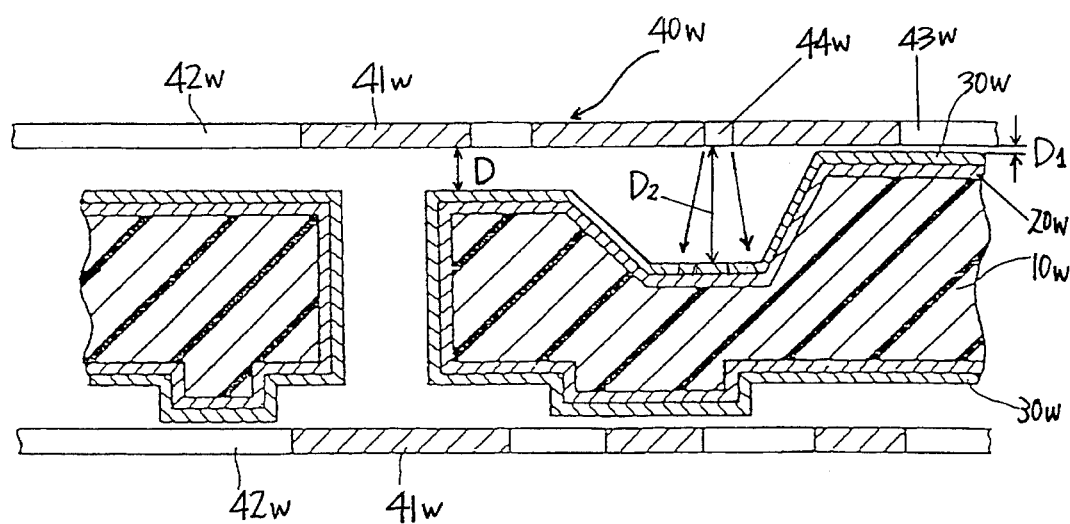
FIG. 22 shows an exposing step of a photoresist layer with the use of a photomask of the prior art.

It is also possible to use the sunlight as the parallel light beam. For example, As shown in FIG. 21, a secondary light beam 3v as a reflection of the sunlight 2v is cut by a shield 92v which is in a cylindrical form. The shield 92v is provided with a shutter 93v. A three-dimensionally molded substrate 10v is put on a stage 94v having a sun-position tracking system 95v within the shield 92v. After an angle of the stage 94v is adjusted by the tracking system 95v such that the substrate 10v faces the sun 1v, the shutter 93v is opened to radiate the sunlight 2v to a photomask 40v placed in front of a photoresist layer 30v on the substrate 10v. An exposure amount is counted by an exposure counter 96v arranged at a position under the shutter 93v. Therefore, when the exposure amount is reaches to a predetermined exposure amount, the shutter 93v is automatically closed. In this case, since the sunlight 2v includes a lot of lights with different wavelengths, it is also possible to use as the photoresist layer 30v a photoresist material which can be exposed by a ray except ultraviolet.

What is claimed is:

1. A method of manufacturing a printed circuit board comprising the steps of:

providing a substrate having a first surface and a second surface being in a different plane than said first surface, said first and second surfaces having a conductive layer thereon, said conductive layer having a photoresist layer thereon;

placing a single planar photomask adjacent to and spaced above said photoresist layer and being substantially parallel to respective planes containing said first and second surfaces, said photomask being formed with an opaque mask pattern and a light-transmissive pattern;

radiating a parallel light beam through said photomask to said photoresist layer to provide an exposed pattern of an intended width "L" on said photoresist layer corresponding to said light-transmissive pattern;

removing said exposed pattern of said photoresist layer to leave a patterned area of said conductive layer not covered by said photoresist layer; and forming a circuit pattern on said conductive layer on said substrate in accordance with said patterned area of said conductive layer;

said method being characterized in that:

(1) said light-transmissive pattern is configured so as to satisfy the following relationships:

when D=0, W/L=1, when D>0, W/L<1, wherein "W" is a width of said light-transmissive pattern for forming said exposed pattern of said intended width "L", and "D" is a distance between said light-transmissive pattern and said photoresist layer;

(2) said planar photomask comprises a first photomask portion having a first size ratio "W1/L1", which is disposed such that it is spaced from said photoresist layer on said first surface by a distance D1 in which D1 is ≧0, and at least one second photomask portion having a second size ratio "W2/L2", which is disposed such that it is spaced from said photoresist layer on said second surface by a distance D2 in which D2 is >0 and in which D2 is >D1, wherein "L1" is a first intended width of said exposed pattern to be formed on said photoresist layer on said first surface, "W1" is a first width of said light-transmissive pattern of said first photomask portion used to form said exposed pattern having said first intended width "L1", "L2" is a second intended width of said exposed pattern-to be formed on said photoresist layer on said second surface, "W2" is a second width of said light-transmissive pattern of said second photomask portion used to form said exposed pattern having said second intended width "L2", and said first size ratio is greater than said second size ratio;

(3) said planar photomask is disposed such that said light beam is radiated to said photoresist layer on said first surface though said light-transmissive pattern of said first photomask portion and to said photoresist layer on said second surface through said light-transmissive pattern of said second photomask portion.

2. A method of manufacturing said printed circuit board according to claim 1, wherein when said photoresist layer is a positive-working photoresist layer, said exposed pattern of said photoresist layer is removed to leave a patterned area of said conductive layer.

3. A method of manufacturing said printed circuit board according to claim 1, wherein when said photoresist layer is a negative-working photoresist layer, said non-exposed pattern of said photoresist layer is removed to leave a patterned area of said conductive layer.

4. A method of manufacturing said printed circuit board according to claim 1, wherein said substrate is formed with a plurality of additional surfaces at varying elevations.

5. A method of manufacturing said printed circuit board according to claim 4, wherein when there is an area satisfying that said distance D is larger than a threshold distance $D_{max}$, an additional planar photomask is placed in front of said photoresist layer of said particular area.

6. A method of manufacturing said printed circuit board according to claim 5, wherein said parallel light beam is radiated selectively on one of said photomask and said additional photomask, while shielding the other one by the use of a blind mask.

7. A method of manufacturing said printed circuit board according to claim 5, wherein said photomask and said additional photomask have marginal portions which overlap with each other.

8. A method of manufacturing said printed circuit board according to claim 7, wherein at least one joining member extends between said overlapped marginal portions of said photomask and said additional photomask.

9. A method of manufacturing said printed circuit board according to claim 5, wherein said additional photomask has a light-transmissive pattern which is identical to as said light-transmissive pattern of said photomask.

10. A method of manufacturing said printed circuit board according to claim 1, wherein said substrate is provided with positioning means for supporting said photomask on said substrate.

11. A method of manufacturing said printed circuit board according to claim 1, wherein an additional planar photomask having a mask pattern which is identical to that of said photomask is placed above said photomask such that said mask pattern of said additional photomask is completely overlaps said mask pattern of said photomask.

12. A method of manufacturing said printed circuit board according to claim 1, wherein said parallel light beam is provided from a collimator.

13. A method of manufacturing said printed circuit board according to claim 1, wherein said parallel light beam is provided by widening a laser beam with the use of an optical lens.

14. A method of manufacturing said printed circuit board according to claim 1, wherein said parallel light beam is provided by widening a light beam passing through a pin hole with the use of an optical lens.

15. A method of manufacturing said printed circuit board according to claim 1, wherein the sunlight is used as said parallel light beam.

16. A method of manufacturing said printed circuit board according to claim 1, wherein said photomask is provided with a light-transmissive plate and two identical mask patterns which are formed on the opposite surfaces of said plate such that one of said mask patterns is completely overlapped with the other one of said mask patterns with respect to a radiating direction of said parallel light beam.

17. A method of manufacturing said printed circuit board according to claim 16, wherein said mask patterns are made of a light-absorption material.

18. A method of manufacturing said printed circuit board according to claim 1, wherein said substrate is disposed in a case having a top opening, said photomask is fixed to said case.

* * * * *